(12) United States Patent
Hirai et al.

(10) Patent No.: US 6,201,742 B1
(45) Date of Patent: Mar. 13, 2001

(54) CIRCUIT THAT PREVENTS ILLEGAL TRANSFORMATION OF DATA IN A NON-VOLATILE MEMORY AND A METHOD FOR THE SAME

(75) Inventors: Tendo Hirai; Yasuo Kousaki; Masashi Asakawa, all of Kanagawa (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/534,313

(22) Filed: Mar. 23, 2000

(30) Foreign Application Priority Data

Sep. 2, 1999 (JP) ................................. 11-249318

(51) Int. Cl.[7] ................................................. G11C 7/00
(52) U.S. Cl. ................................... 365/189.09; 365/185.2
(58) Field of Search ........................... 365/185.2, 185.09, 365/230.08, 230.03

(56) References Cited

U.S. PATENT DOCUMENTS 4,908,798 * 3/1990 Urai ................................. 365/230.03

* cited by examiner

Primary Examiner—Terrell W. Fears
(74) Attorney, Agent, or Firm—Arent Fox Kintner Plotkin & Kahn, PLLC

(57) ABSTRACT

A circuit that prevents illegal transformation of data in a non-volatile memory comprises a three circuits which generate three reference currents of different amplitude, there comparison circuits which respectively compare the three reference currents with a cell current, a writing/deletion circuit which writes data in or deletes data from the cells. A control circuit is provided which outputs a corresponding information based on the result of comparison by the comparison circuit, and makes said writing/deletion circuit execute writing data in or deletion of data from a target cell once more when the cell current is greater than the second reference current or the cell current is not greater than the third reference current.

18 Claims, 18 Drawing Sheets

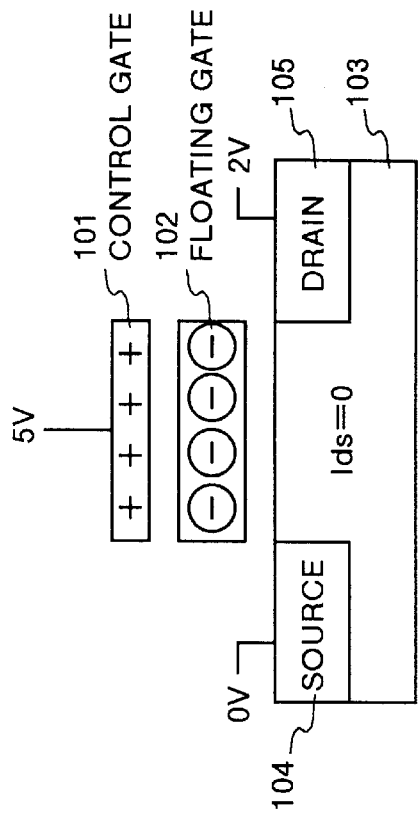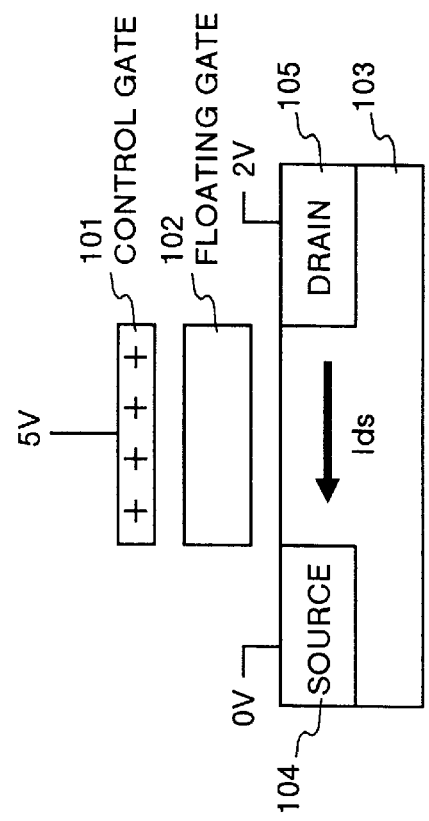

CIRCUIT THAT PREVENTS ILLEGAL TRANSFORMATION OF DATA IN A NON-VOLATILE MEMORY AND A METHOD FOR THE SAME

FIELD OF THE INVENTION

The present invention relates to a circuit that prevents illegal transformation of data in a non-volatile memory and method for the same. More specifically, this invention relates to a technology that makes it possible to prevent a malfunction in data reading caused due to charge gain or charge loss to a floating gate constituting a cell in an electrically-rewritable non-volatile memory.

BACKGROUND OF THE INVENTION

An electrically-rewritable non-volatile memory can store and maintain data stored therein for more than ten years. Further, it is possible to electrically rewrite the data or delete the data. Therefore, the electrically-rewritable non-volatile memory has become indispensable as an important component of electronic equipment used in communications and/or data processing.

The reliability of data stored in the electrically-rewritable non-volatile memory is high. Further, this high reliability can be maintained for a long period of time even if no special processing is performed. Because of such a high reliability, however, if an illegal transformation of data transformation takes place, a system or the like that uses the electrically-rewritable non-volatile memory is seriously affected. In order to prevent the damage of the system, it is necessary to maintain the high reliability of the electrically-rewritable non-volatile memory for a long period of time.

FIG. 14 shows a general configuration of an example of a conventional electrically-rewritable non-volatile memory. As shown in FIG. 14, generally a memory call used in a non-volatile memory has the configuration in which an electrically-insulated floating gate 102 is provided in a MOS transistor structure between a p-type silicon substrate 103 and a control gate 101. Accordingly, when electrons enter the floating gate 102, the electrons can not escape because the floating gate 102 is electrically insulated. When a voltage is loaded to an n-type drain 105 and an n-type source 104 and further a voltage is loaded to the control gate 101, then a current Ids starts flowing from the n-type drain 105 to the n-type source 104. The gate voltage when this current Ids starts flowing is termed as the threshold voltage Vth.

FIG. 15A explains the operation of the electrically-rewritable non-volatile memory shown in FIG. 14 when writing the data, and FIG. 15B explains the operation when deleting the data. When writing the data, as shown in FIG. 15A, a high voltage of 12 V is loaded to the control gate 101, and a voltage of 0 V and a voltage of 6 V are loaded to the source 104 and the drain 105 respectively. When such voltages are loaded, the current Ids starts flowing between the drain 105 and the source 104. However, the electric field near the drain 105 between the drain and source becomes stronger so that electrons are accelerated. As a result, the so-called hot electrons are generated, and some of the hot electrons pass through an energy barrier of an oxide film on the floating gate 102 and enter the floating gate 102. Because of this phenomenon, electrons are injected into the floating gate 102 so that the threshold voltage Vth of the memory cell rises.

When writing the data, as shown in FIG. 15B, a voltage of 0 V is loaded to the control gate 101 and a voltage of 12 V loaded to the source 104, and the drain 105 kept open. In this case, a high electric field is generated in the portion between the source 104 and floating gate 102, and because of a physical effect called the Fowler-Nordheim tunnel, the electrons from the floating gate escape to the source 104. Because of this escape of electrons from the floating gate 101, the threshold voltage in the memory cell drops.

FIG. 16A and FIG. 16B explain an operation for reading out data from the memory cell which data has been written in or deleted from due to the data write/delete operation shown in FIG. 15A and FIG. 15B. When data is to be read out, a voltage of 5 V is loaded to the control gate 101, and a voltage of 2 V is loaded to the drain 105 and a voltage of 0 V is loaded to the source 104. FIG. 16A explains the operation of reading out data from the memory cell which is in a data-written state (data-written state means that some data has already been written in the memory cell). In the case shown in FIG. 16A, electrons are injected into the floating gate 102, so that a voltage loaded to the control gate 101 is canceled and the current Ids does not flow.

FIG. 16B explains the operation of reading out data from the memory cell which is in a data-deleted state (data-deleted state means that the data has already been deleted from the memory cell). In the case shown in FIG. 16B, there are no electrons in the floating gate 102, so that a voltage loaded to the control gate 101 functions as a gate voltage and the current Ids flows. Thus, the current Ids does not flow in a memory cell that is in the data-written state because electrons are injected into the floating gate 102. When it is detected that no current flows, information "0" is readout. On the other hand, the current Ids flows in a memory cell that is in the data-deleted state because electrons are not injected into the floating gate 102. When it is detected that current Ids flows, information "1" is read.

As described above, by loading a voltage of 5 V to the control gate, a state of the memory cell is determined by checking whether the current Ids flows between the source and drain. FIG. 17 shows a relation between a magnitude of the current between the drain and the source in a reference cell based on the conventional technology and a magnitude of the current between the drain and the source in a memory cell which is in data-written state or state-deleted state. In FIG. 17, the horizontal axis represents a voltage Vgs between the gate and the source and the vertical axis represents the current Ids between the source and the drain.

As can be confirmed from FIG. 17, when a voltage Vread for reading out data is loaded to the control gate 101, the current Ids flows between the source 104 and the drain 105 as explained above. Whether the current Ids flows or not can be determined by checking whether the current Ids when the voltage is Vread is greater than a threshold of the reference current Iref1. Precisely, when the current Ids is greater than the reference current Iref1, it is considered that the current Ids is detected and in this case information "1" is output. On the other hand, when the current Ids is equal to or less than the reference current Iref1, it is considered that the current Ids is not detected and in this case information "0" is output. When the written state of the memory cell is normal, the current when the voltage is Vread is assumed to be Ids0. When the data deleted state of the memory cell is normal, the current when the voltage is Vread is assumed to be Ids1. The magnitude of the reference current Iref1 is set in such a manner that it is less than the magnitude of the current Isd1 and greater than the magnitude of the current Ids0.

FIG. 18 shows an example of a conventional circuit which reads data from a non-volatile memory when the current Ids is detected. As shown in FIG. 18, a sense-amplifier SA compares a current Icell as the current Ids from a memory cell in a memory cell array with a reference current Iref1 from a reference current cell. By outputting information "1" or "0" to a not shown output buffer based on this comparison, data is read out from the memory cell array.

In the conventional type of non-volatile memory as described above, when electrons are injected into or discharged from the floating gate 102, it is assumed that this state is preserved permanently.

Recently, in association with the tendency for a higher degree of integration and the need for reduction of power consumption in a memory, the total amount of electric charge which can be accumulated in the floating gate 102 has reduced. Because the total amount of electric charge has reduced, there is a disadvantage that it has become difficult to maintain the data written/deleted state for a longer period of time. In addition, in association with the tendency for a higher degree of integration the memory cells are arranged very close to each other so that charge gain in which unintended electric charge is injected to the floating gate 102 or charge loss in which electric charge is discharged from the floating gate 102 easily occurs when data is read out, and sometimes erroneous data may be read out.

In order to solve the above problem, a defect of an oxide film on the floating gate 102 occurring due to the tendency for a higher degree of integration in a memory cell is detected in the early stage such as in a device testing process to prevent erroneous data from being read out. However, even with such measures it is impossible to assuredly prevent the charge gain or charge loss.

SUMMARY OF THE INVENTION

It is an object of the present invention to provide a circuit which insures preservation of a data-written/deleted state in an electrically-rewritable non-volatile memory and also prevents illegal transformation of data and a method for the same.

According to one aspect of the present invention, a circuit is provided which generates three reference currents of different amplitude, there comparison circuits are provided which respectively compare the three reference currents with a cell current. When the cell current is greater than a first reference current (a default current), the control circuit outputs an information "1", and further, when the cell current is not greater than a second reference current (greater in magnitude than the first reference current), the control circuit determines that a charge gain or charge loss has occurred in the target cell. When the cell current is not greater than the first reference current, the control circuit outputs an information "0", and further, when the cell current is greater than a third reference current (smaller in magnitude than the first reference current), the control circuit determines that a charge gain or charge loss has occurred in the target cell.

According to another aspect of the present invention, three circuits are provided which generate reference currents of different amplitude, one selection circuit is provided which selects and outputs one of the three reference currents, one comparison circuit is provided which compares the reference current output from the selection circuit with a cell current. When the cell current is greater than a first reference current (a default current), the control circuit outputs an information "1", and further, when the cell current is not greater than a second reference current (greater in magnitude than the first reference current), the control circuit determines that a charge gain or charge loss has occurred in the target cell. When the cell current is not greater than the first reference current, the control circuit outputs an information "0", and further, when the cell current is greater than a third reference current (smaller in magnitude than the first reference current), the control circuit determines that a charge gain or charge loss has occurred in the target cell.

According to still another aspect of the present invention, one circuit is provided which generates a reference current, one amplification/attenuation circuit is provided which can obtain two more reference currents by amplification and attenuation of the reference current, a comparison circuit is provided which compares the reference current output from the amplification/attenuation circuit with a cell current. When the cell current is greater than a first reference current (a default current), the control circuit outputs an information "1", and further, when the cell current is not greater than a second reference current (obtained by amplification of the first reference current), the control circuit determines that a charge gain or charge loss has occurred in the target cell. When the cell current is not greater than the first reference current, the control circuit outputs an information "0", and further, when the cell current is greater than a third reference current (obtained by attenuation of the first reference current), the control circuit determines that a charge gain or charge loss has occurred in the target cell.

According to still another aspect of the present invention, one circuit is provided which generates a reference current, one amplification/attenuation circuit is provided which can obtain two more currents by amplification and attenuation of a cell current, a comparison circuit is provided which compares the reference current with the cell current output from the amplification/attenuation circuit. When a first cell current (a default current) is greater than the reference current, a control circuit outputs an information "1", and further, when a second cell current (obtained by attenuation of the first cell current) is not greater than the reference current, the control circuit determines that a charge gain or charge loss has occurred in the target cell. When the first cell current is not greater than the reference current, the control circuit outputs an information "0", and further, when a third cell current (obtained by amplification of the first cell current) is greater than the reference current, the control circuit determines that a charge gain or charge loss has occurred in the target cell.

According to still another aspect of the present invention, a cell current is read, three reference currents are generated, and the three reference currents are compared with the cell current. When the cell current is greater than a first reference current (a default current), an information "1" is output, and further, when the cell current is not greater than a second reference current (greater in magnitude than the first reference current), it is determined that a charge gain or charge loss has occurred in the target cell. When the cell current is not greater than the first reference current, an information "0" is output, and further, when the cell current is greater than a third reference current (smaller in magnitude than the first reference current), it is determined that a charge gain or charge loss has occurred in the target cell.

Other objects and features of this invention will become apparent from the following description with reference to the accompanying drawings.

BRIEF DESCRIPTION OF THE DRAWINGS

FIG. 16A and FIG. 16B explain operation for reading out data from an electrically-rewritable non-volatile memory;

DESCRIPTION OF THE PREFERRED EMBODIMENTS

Preferred embodiments of the circuit that prevents illegal transformation of data in a non-volatile memory and a method for the same according to the present invention are described in detail below.

Figure 1:
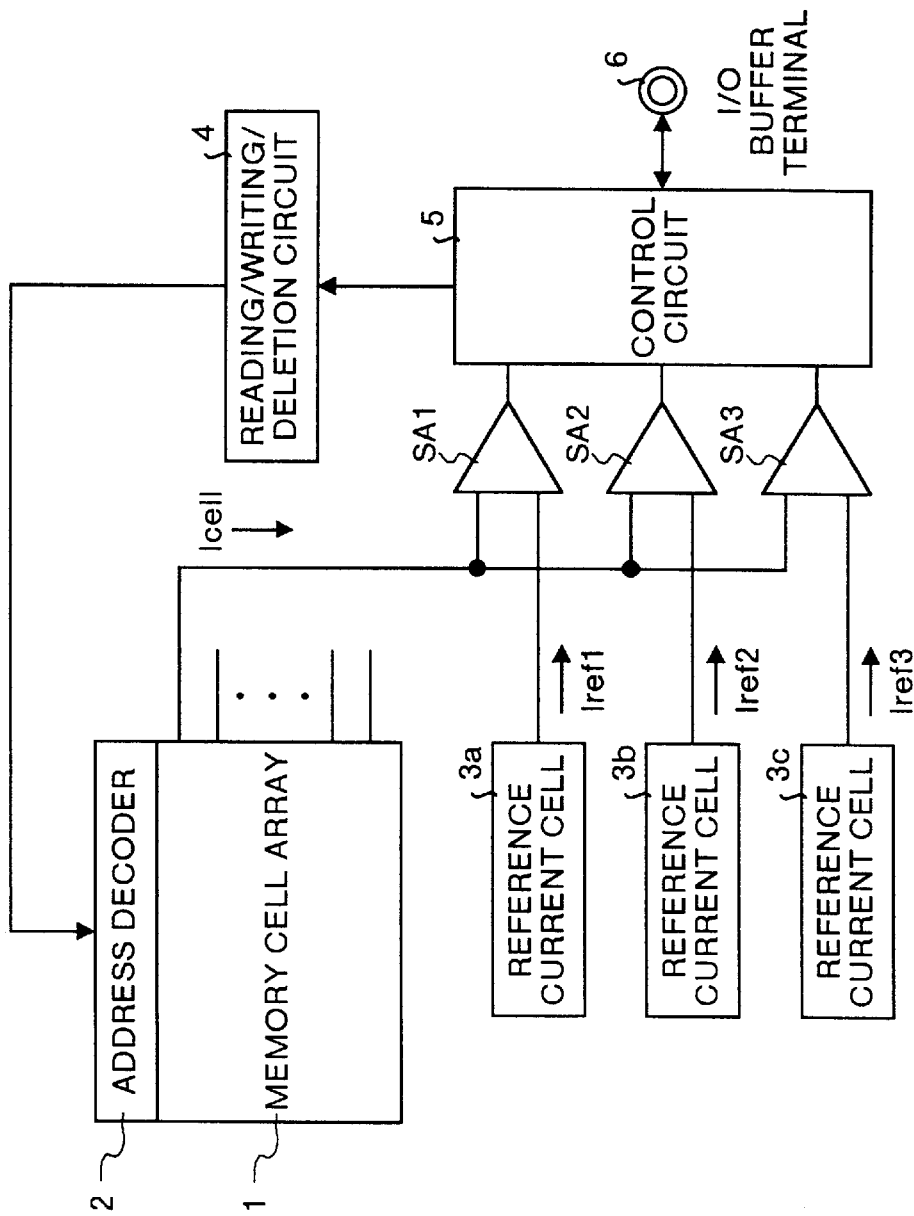
FIG. 1 shows a configuration of a circuit that prevents illegal transformation of data in a non-volatile memory according to a first embodiment of the present invention.
Figure 14:
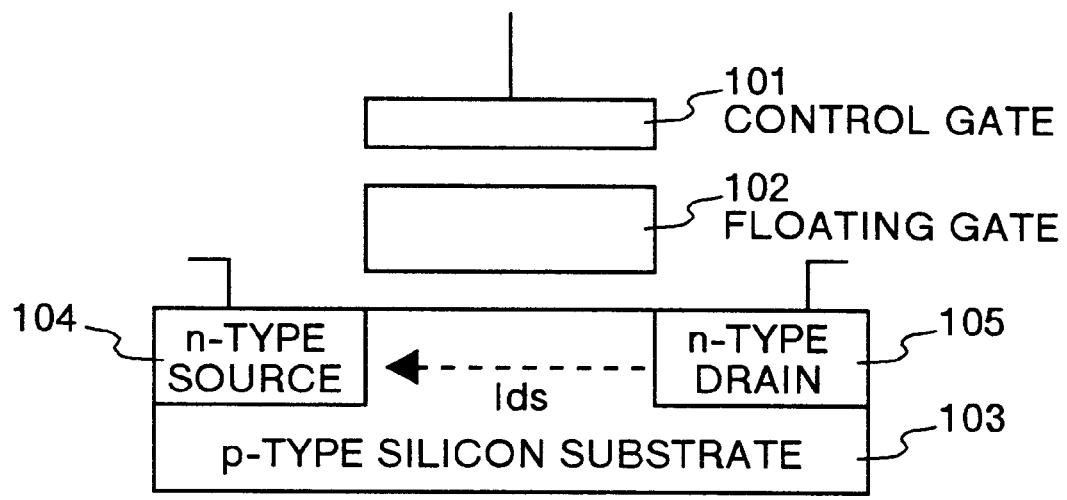
FIG. 14 shows a general configuration of an electrically-rewritable non-volatile memory.
Figure 15A:
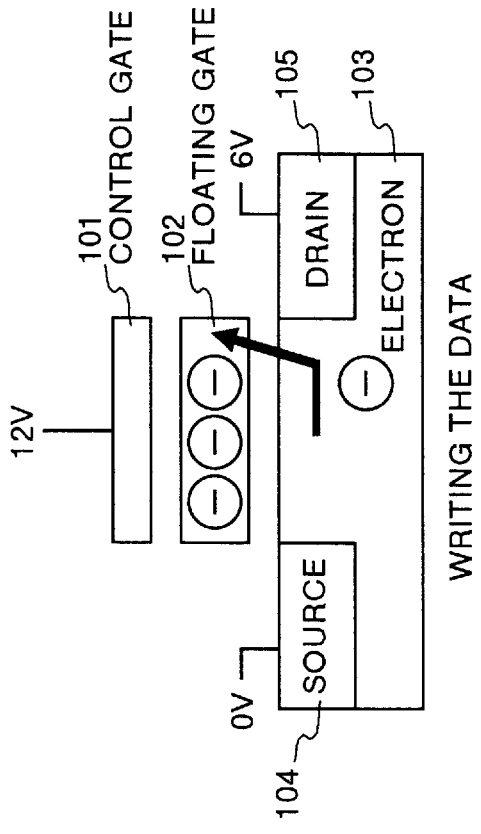
FIG. 15A explains the operations for writing data in and FIG. 15B explains the operations for deleting data from an electrically-rewritable non-volatile memory.
Figure 15B:
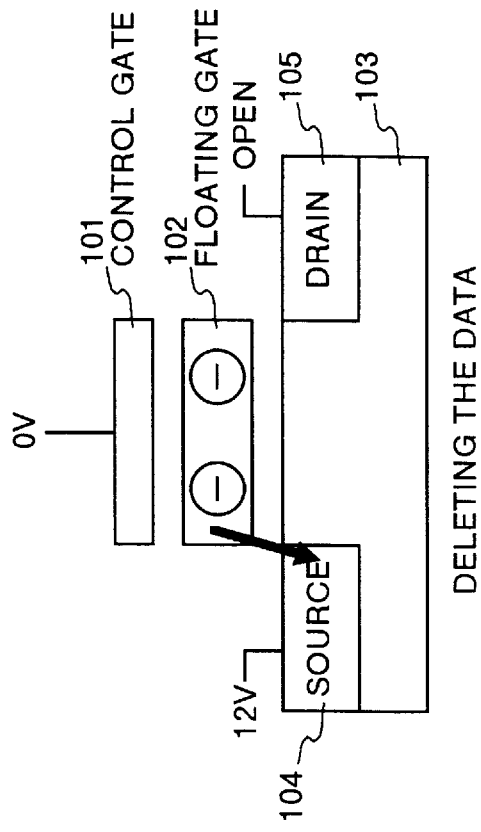
Figure 17:
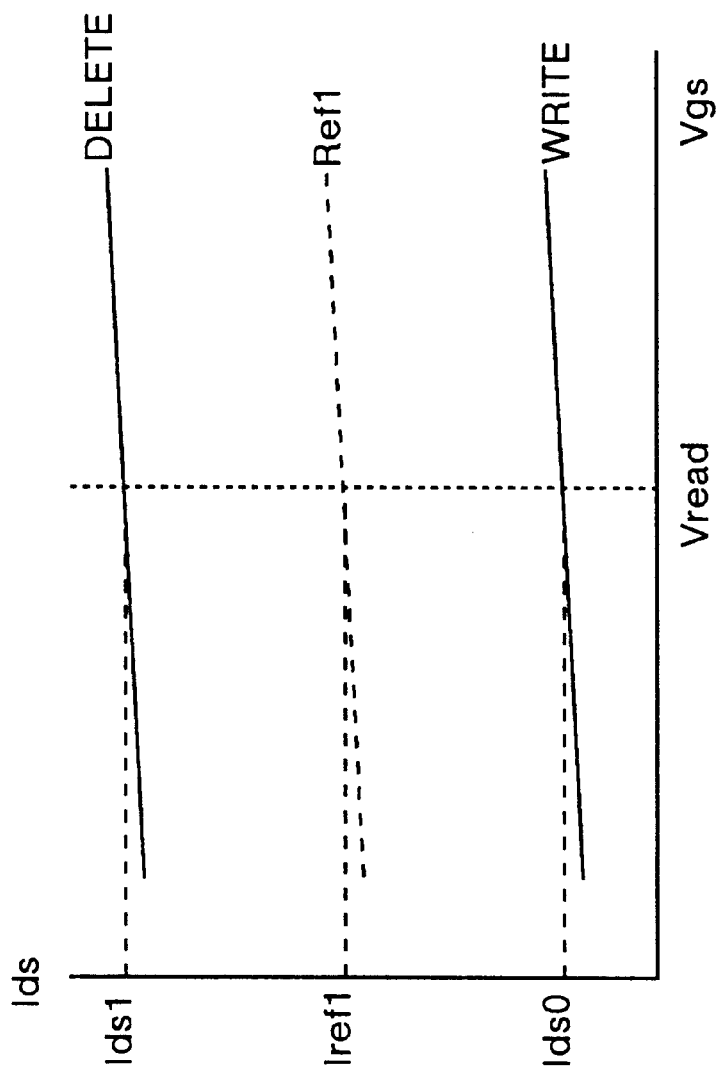
FIG. 17 shows a relation between a magnitude of a current between a drain and a source in a conventional reference cell and a magnitude of a current between a drain and a source when data is written in or deleted from a memory cell.

FIG. 1 shows a configuration of the circuit that prevents illegal transformation of data in a non-volatile memory according to a first embodiment of the present invention. A memory cell array 1 sown in FIG. 1 comprises an array of memory cells in the electrically-rewritable non-volatile memory shown in FIG. 14. An address decoder 2 decodes an address identifying a memory cell as an object for the processing for reading data therefrom, writing data therein, and deleting data therefrom. The memory cell array 1 outputs a current Icell as a current between the source and the drain in correspondence to the array when data is read out.

Figure 2:
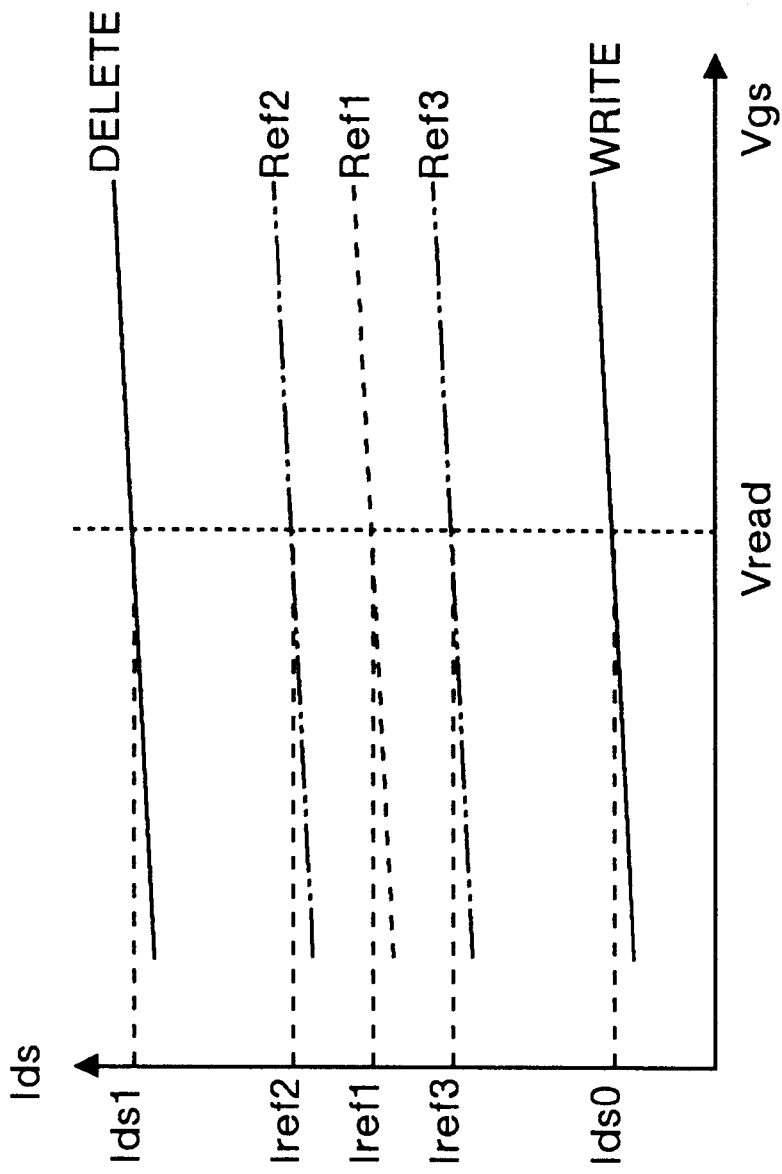
FIG. 2 shows a relation between a magnitude of a current between a drain and a source in a reference cell used in the circuit that prevents illegal transformation of data in a non-volatile memory according to the first embodiment and a magnitude of a current between the drain and the source when data is written in or deleted from a memory cell.
Figure 18:
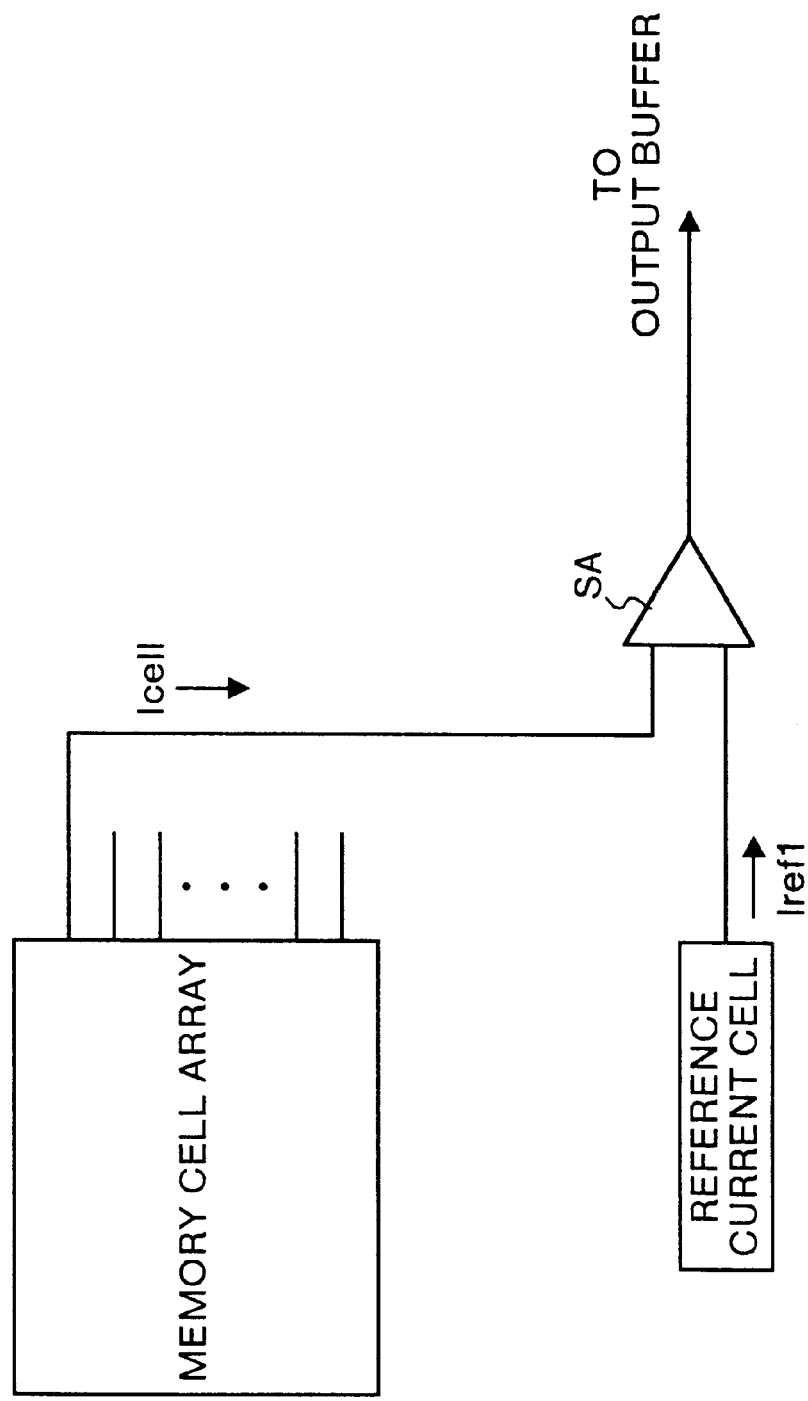
FIG. 18 shows an example of a conventional circuit which reads out data from a non-volatile memory.

Reference current cells 3a, 3b and 3c respectively output reference currents Iref1, Iref2 and Iref3 each having a different magnitude. The magnitude of the reference current Iref1 is the same as that of the reference current Iref1 shown in FIG. 18, and an information for a memory cell from which data is read out is determined by checking whether the magnitude of the current Icell is greater than that of the reference current Iref1 or not. The magnitude of the reference current Iref2 is, as shown in FIG. 2, larger than that of the reference current Iref1 and less than that of the current Ids1. As explained in the description of the conventional art, Ids1 is the magnitude of the current between the source and the drain when data in the memory cell is normally deleted from the memory cell. The magnitude of the reference current Iref2 is so set that it is conceivable that illegal transformation of data may occur when charge gain continues above this value. The magnitude of the reference current Iref3 is, as shown in FIG. 2, less than that of the reference current Iref1, but larger than that of a current Ids0. As explained in the description of the conventional art, Ids0 is the magnitude of the current between the source and the drain when data is normally written in the memory cell. The magnitude of the reference current Iref2 is so set that it is conceivable that illegal transformation of data may occur when charge loss continues below this value.

A sense amplifier SA1 compares the magnitude of the current Icell to that of the reference current Iref1. A sense amplifier SA2 compares the magnitude of the current Icell to that of the reference current Iref2. Similarly, a sense amplifier SA3 compares the magnitude of the current Icell to that of the reference current Iref3. The sense amplifiers SA1 to SA3 output the result of this comparison to a control circuit 5.

A reading/writing/deletion circuit 4 accesses, under controls by the control circuit 5, a desired memory cell in the memory cell array 1 to execute the processing of writing data therein or reading out and deleting data therefrom. The processing for reading out data and processing for writing or deleting data are controlled based on various types of control signal (such as a write enable signal).

The control circuit 5 outputs a data from a memory cell from which data has been read out through an I/O buffer terminal 6 based on a result of comparison by the sense amplifier SA1. Further, the control circuit 5 determines, based on a result of comparison by the sense amplifiers SA2 and SA3, whether the processing for writing data again in or deleting data again from the memory cell from which the data is read out should be executed or not. When it is determined that the processing for writing or deleting data again should be executed, the control circuit 5 orchestrates the reading/writing/deletion circuit 4 so as to execute the processing for writing or deleting data once more.

Figure 3:
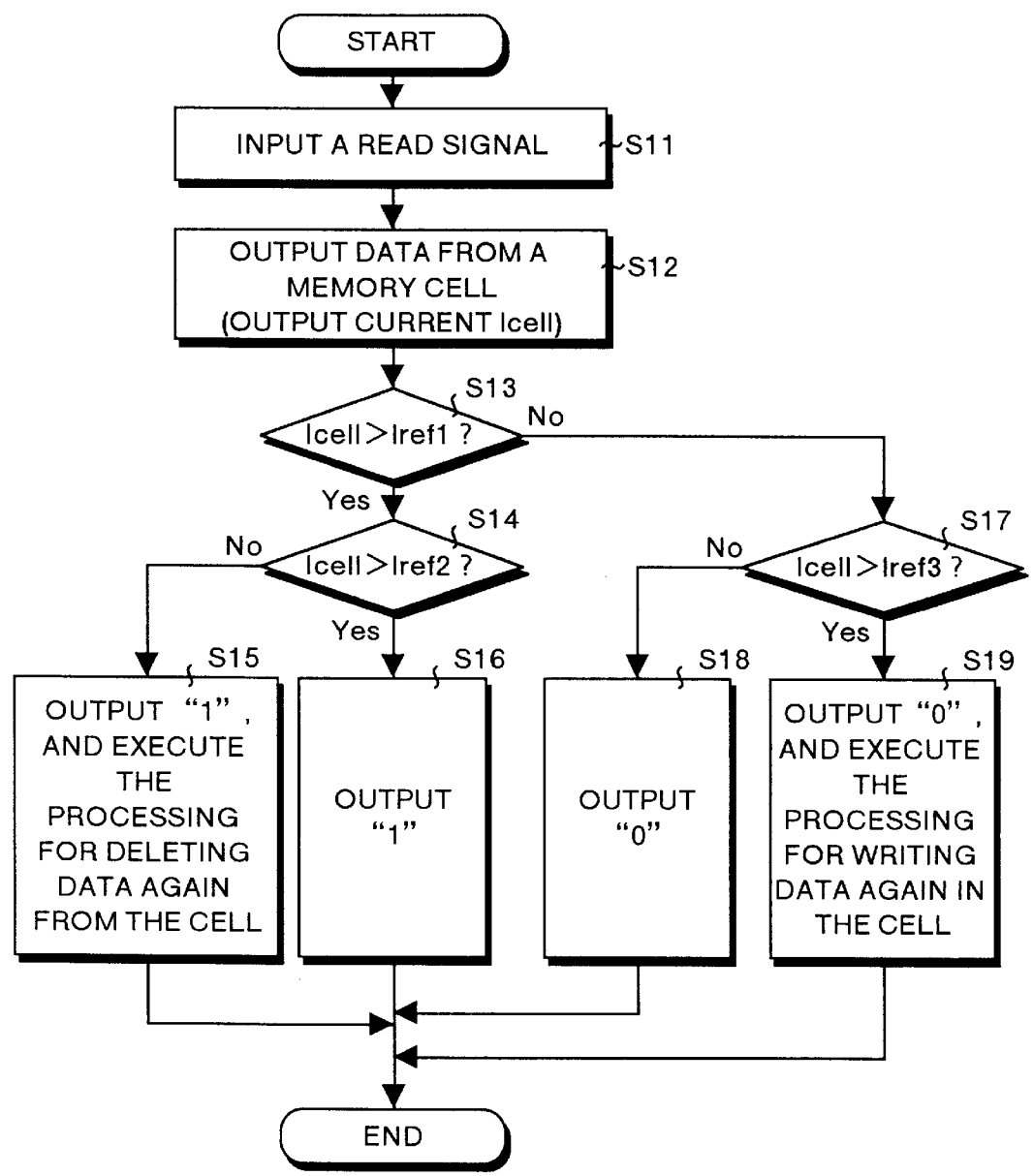
FIG. 3 is a flow chart showing a process of prevention of illegal transformation of data in the first embodiment.

A process of prevention of illegal transformation of data in the first embodiment of the present invention is explained below with reference to the flow chart shown in FIG. 3. As shown in FIG. 3, when the control circuit 5 receives a read signal through the I/O buffer terminal 6, the control circuit 5 sends the read signal to the reading/writing/deletion circuit 4 to make it execute the process of reading a data from the memory cell array 1 (step S11). With this operation, a current Icell is output from a target memory cell (i.e. a memory cell from which the data is to be read) of the memory cell array 1 (step S12).

This current Icell is input into the sense amplifiers SA1, SA2 and SA3, and is compared with the respective reference currents Iref1, Iref2 and Iref3. The control circuit 5 executes the following processing based on a result of comparison by the sense amplifiers SA1, SA2 and SA3. At first, the control circuit 5 determines whether the current Icell is greater than the reference current Iref1 or not (step S13). When it is determined that the current Icell is greater than the reference current Iref1 (step S13, YES), the control circuit 5 further determines whether the current Icell is greater than the reference current Iref2 or not (step S14). When it is determined that the current Icell is greater than the reference current Iref2 (step S14, YES), the control circuit 5 outputs information "1" as the information regarding the target memory cell (step S16) and the process is terminated.

When it is determined that the current Icell is not greater than the reference current Iref2 (step S14, NO), the control circuit 5 outputs information "1" as the information regarding the target memory cell and the process of deletion of data from the target memory cell is executed once more (step S15). The process is then terminated. The process of deletion of data is executed once more in order to insure the output of the information "1".

When it is determined that the current Icell is not greater than the reference current Iref1 (step S13, NO), the control circuit 5 further determines whether the current Icell is greater than the reference current Iref3 or not (step S17). When it is determined that the current Icell is not greater than the reference current Iref3 (step S17, NO), the control circuit 5 outputs information "0" as the information regarding the target memory cell (step S18) and the process is terminated.

When it is determined that the current Icell is greater than the reference current Iref3 (step S17, YES), the control circuit 5 outputs information "0" as the information regarding the target memory cell and the process of writing data in the target memory cell is executed once more (step S19). The process is then terminated. The process of writing data is executed once more in order to insure output of the information "0".

The processing for writing or deleting data once more in the steps S15 and S19 are executed each time in the description above, but the configuration is allowable in which an address of a memory cell requiring the processing for writing or deleting data again and information indicating the necessity of "deleting again" or "writing again" or the like are stored, and the processing for deleting data again or for writing data again" is executed based on the stored data and information to each memory cell when there is no access to the memory cell array 1. By executing the processing for deleting data again or for writing data again as described above, it is possible to efficiently execute the processing for deleting data again or for writing data again. Further, access to the memory cell array 1 is not hindered, so that the high speed processing for reading out data can be insured.

According to the first embodiment described above, the current Icell output from a memory cell when data is read out therefrom is monitored, and in addition to the determination using the information "1" and "0", whether charge gain or charge loss has occurred or not is determined based on the reference currents Iref2 and Iref3. Further, based on the result of such determination, deleting or writing of data from the target memory cell is executed once more. Thus, a data storage state of the memory cell can be preserved with high reliability, illegal transformation of data can be prevented before its occurrence.

A second embodiment of the present invention is explained below. In the first embodiment described above, in addition to the sense amplifier SA1 which compares the reference current Iref1 with the current Icell, sense amplifiers SA2 and SA3 which compare the current Icell with reference currents Iref2 and Ired3 respectively are provided. In the second embodiment, however, deletion or writing of data once more as explained in the first embodiment can be executed using only a single sense amplifier.

Figure 4:
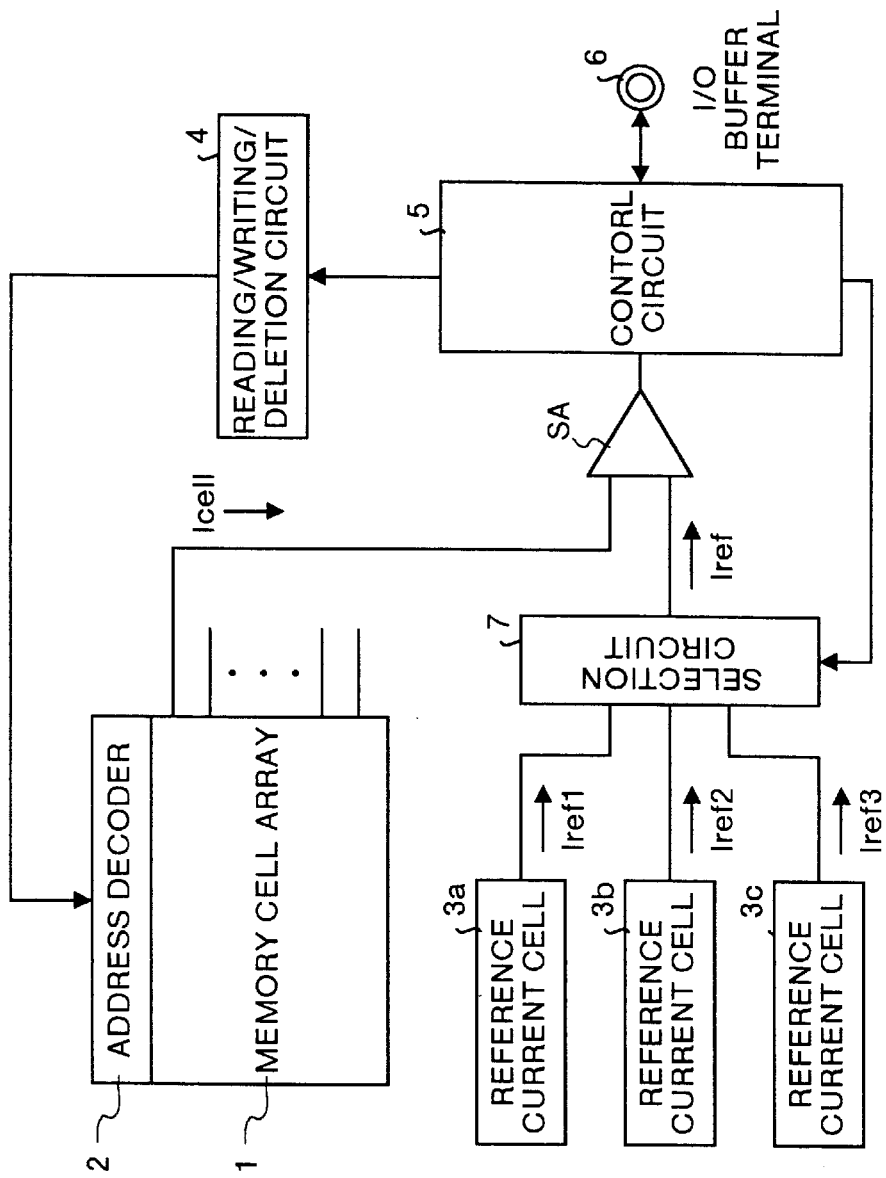
FIG. 4 shows a configuration of a circuit that prevents illegal transformation of data in a non-volatile memory according to a second embodiment of the present invention.

FIG. 4 shows a configuration of the circuit that prevents illegal transformation of data in a non-volatile memory according to the second embodiment of the present invention. As shown in FIG. 4, a selection circuit 7 which selects any of the reference currents Iref1, Iref2 and Iref3 output from the reference current cells 3a, 3b and 3c respectively under the control of the control circuit 5 and outputs the selected reference current to one sense amplifier SA is newly provided. Thus, the sense amplifiers SA2 and SA3 are not provided. The remaining configuration is the same as that of the first embodiment described above, and the same reference numerals are assigned to the same components.

The sense amplifier SA compares the current Icell output from a target memory cell with the reference current Iref output from the selection circuit 7, and inputs the result of comparison into the control circuit 5. This reference current Iref is any of the reference currents Iref1, Iref2 and Iref3. The control circuit 5 executes an initial setting so that the output from the selection circuit 7 is the reference current Iref1. The control circuit 5 determines whether the information regarding the target memory cell is "1" or "0" and outputs the result of determination. The control circuit 5 then switches the output from the selection circuit 7 to either the reference current Iref2 or the reference current Iref3, and executes the processing for deleting data again from or for writing data again in the memory cell based on the result of comparison after this setting. Further, the control circuit 5 executes the initial setting to response to the need for reading data from other memory cell so that an output from the selection circuit 7 is the reference current Iref1.

Figure 5:
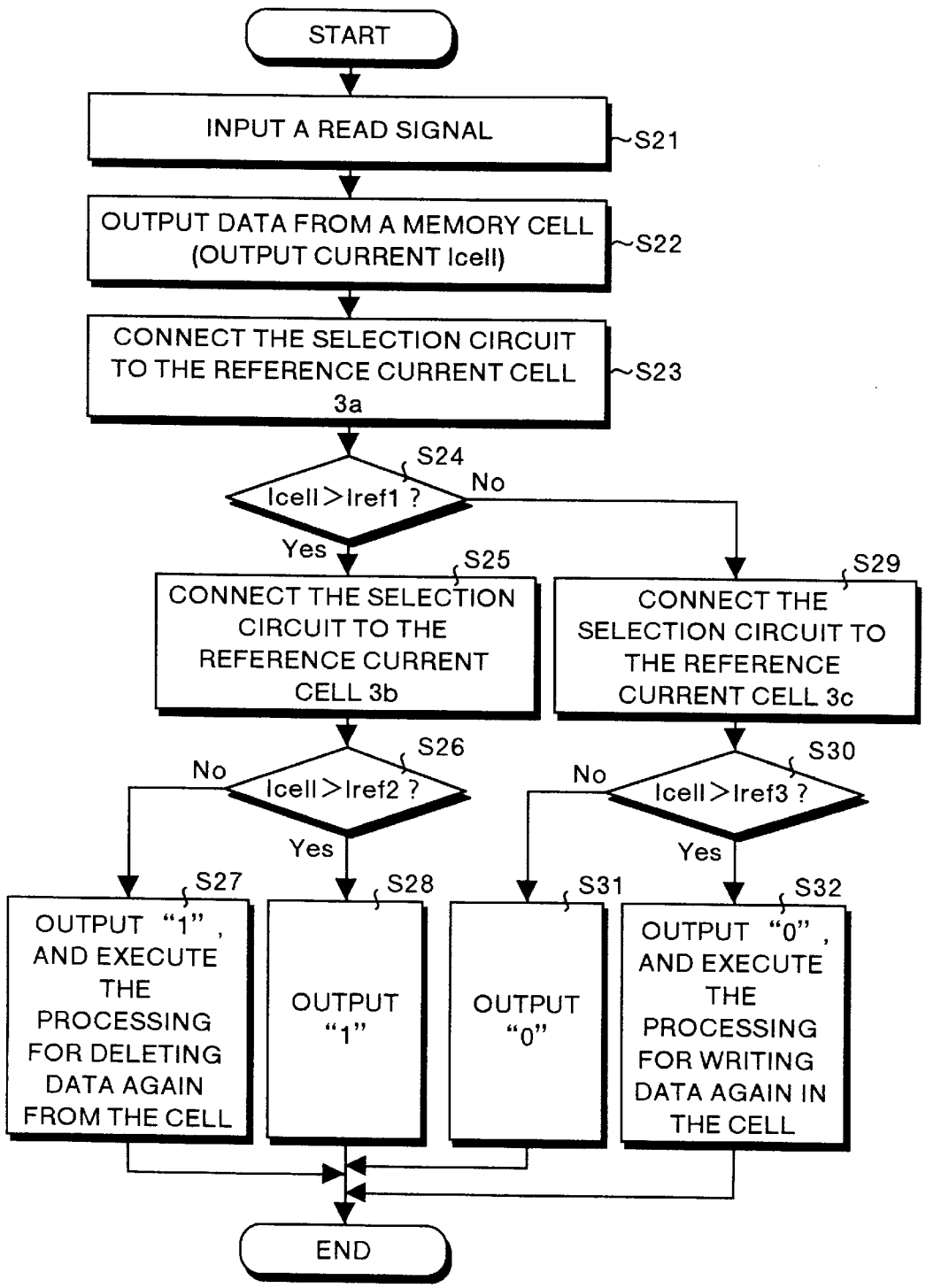
FIG. 5 is a flow chart showing a process of prevention of illegal transformation of data in the second embodiment.

A process of prevention of illegal transformation of data in the second embodiment of the present invention is explained below with reference to the flow chart shown in FIG. 5. As shown in FIG. 5, when the control circuit 5 receives a read signal through the I/O buffer terminal 6, the control circuit 5 sends the read signal to the reading/writing/deletion circuit 4 to make it execute the process of reading a data from the memory cell array 1 (step S21). With this operation, a current Icell is output from a target memory cell of the memory cell array 1 (step S22).

The selection circuit 7 under the control of the control circuit 5 outputs the reference current Iref1 as the default (step S23). The current Icell and the reference current Iref1 output from the selection circuit 7 are input into the sense amplifier SA. The amplifier SA compares the two currents and inputs a result of comparison into the control circuit 5. The control circuit 5 determines based on the result of comparison by the sense amplifier SA whether the current Icell is greater than the reference current Iref1 or not (step S24). When it is determined that the current Icell is greater than the reference current Iref1 (step S24, YES), the control circuit 5 switches the selection circuit 7 so that it outputs the reference current Iref2 (step S25). The control circuit 5 then determines whether the current Icell greater than the reference current Iref2 or not (step S26). When it is determined that the current Icell is greater than the reference current Iref2 (step S26, YES), the control circuit 5 outputs information "1" as the information regarding the target memory cell (step S28) and the process is terminated.

When it is determined that the current Icell is not greater than the reference current Iref2 (step S26, NO), the control circuit 5 outputs information "1" as the information regarding the target memory cell and the process of deletion of data from the target memory cell is executed once more (step S27). The process is then terminated. The process of deletion of data is executed once more in order to insure the output of the information "1".

When it is determined that the current Icell is not greater than the reference current Iref1 (step S24, NO), the control circuit 5 switches the selection circuit so that it outputs the reference current Iref3 (step S29). The control circuit 5 then determines whether the current Icell is greater than the reference current Iref3 or not (step S30). When it is determined that the current Icell is not greater than the reference current Iref3 (step S30, NO), the control circuit 5 outputs information "0" as the information regarding the target memory cell (step S31) and the process is terminated.

When it is determined that the current Icell is greater than the reference current Iref3 (step S30, YES), the control circuit 5 outputs information "0" as the information regarding the target memory cell and the process of writing data in the target memory cell is executed once more (step S32). The process is then terminated. The process of writing data is executed once more in order to insure output of the information "0".

The processing for writing or deleting data once more in the steps S27 and S32 are executed each time in the description above, but the configuration is allowable in which an address of a memory cell requiring the processing for writing or deleting data again and information indicating the necessity of "deleting again" or "writing again" or the like are stored, and the processing for deleting data again or for writing data again" is executed based on the stored data and information to each memory cell when there is no access to the memory cell array 1. By executing the processing for deleting data again or for writing data again as described above, it is possible to efficiently execute the processing for deleting data again or for writing data again. Further, access to the memory cell array 1 is not hindered, so that the high speed processing for reading out data can be insured.

According to the second embodiment described above, the current Icell output from a memory cell when data is read out therefrom is monitored, and in addition to the determination using the information "1" and "0", whether charge gain or charge loss has occurred or not is determined based on the reference currents Iref2 and Iref3. Further, based on the result of such determination, deleting or writing of data from the target memory cell is executed once more. However, the selection circuit 7 is provided and it selects any one of the reference currents Iref1, Iref2 and Iref3 and outputs the selected reference current to one sense amplifier SA. Thus, it is possible to preserve a storage state in a memory cell at high reliability with a simple configuration and also to prevent illegal transformation of data. In addition, whether the current Icell is greater than the reference current Iref2 or Iref3 or not is determined based on a result of comparison between the current Iref1 and current Iref2, so that the efficient processing for determination can be executed.

A third embodiment of the present invention is explained below. In the second embodiment described above, the selection circuit 7 selects one of the three reference currents Iref1, Iref2 and Iref3 and outputs the selected reference current. In the third embodiment, however, one reference current Iref1 is used and amplified or attenuated to generate a reference current corresponding to the reference current Iref2 or Iref3 so that the processing for deleting or writing data again like that in the first and second embodiments can be executed.

Figure 6:
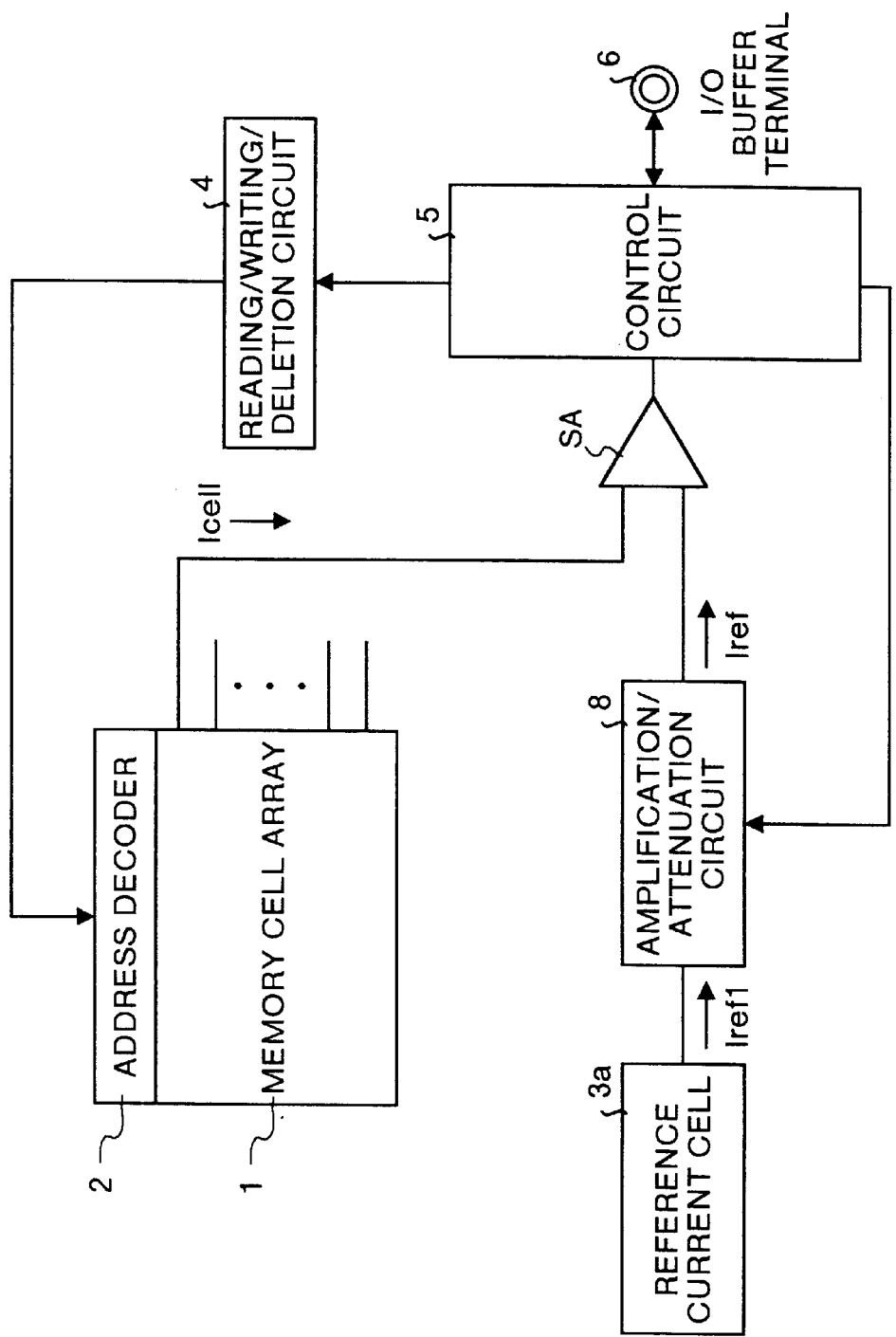
FIG. 6 shows a configuration of a circuit that prevents illegal transformation of data in a non-volatile memory according to a third embodiment of the present invention.

FIG. 6 shows a configuration of the circuit that prevents illegal transformation of data in a non-volatile memory according to the third embodiment of the present invention. The circuit shown in FIG. 6 comprises one reference current cell 3a in place of the reference current cells 3a to 3c in the first and second embodiments, and an amplification/attenuation circuit 8 which amplifies or attenuates the reference current Iref1 output from this reference current cell 3a under control of the control circuit 5 to generates a reference current corresponding to the reference currents Iref2 and Iref3, and outputs the reference current to the sense amplifier SA. The remaining configuration is the same as that of the second embodiment, and the same reference numerals are assigned to the same components.

The sense amplifier SA compares the current Icell output from a target memory cell with the reference current Iref output from the amplification/attenuation circuit 8, and inputs the result of comparison into the control circuit 5. The reference current Iref is any of the reference currents Iref1, Iref2 and Iref3. The control circuit 5 executes an initial setting so that the output from the amplification/attenuation circuit 8 is the reference current Iref1. Precisely, the amplification/attenuation circuit 8 outputs the reference current Iref1 as it is, i.e. without executing amplification or attenuation, to the sense amplifier SA.

The control circuit 5 determines, based on the result of comparison between this reference current Iref1 and current Icell, whether the information regarding the target memory cell is "1" or "0" and outputs the result of determination. The control circuit 5 then makes the amplification/attenuation circuit 8 amplify the reference current Iref1 so that the reference current Iref2 is output, or makes the amplification/attenuation circuit 8 attenuate the reference current Iref1 so that the reference current Iref3 is output. Further, the control circuit 5 executed the processing for deleting or writing data again based on the result of comparison after this setting. Further the control circuit 5, executes the initial setting so that an output from the amplification/attenuation circuit 8 is the reference current Iref1 to respond to the necessity of reading out data from any other memory cell.

Figure 7:
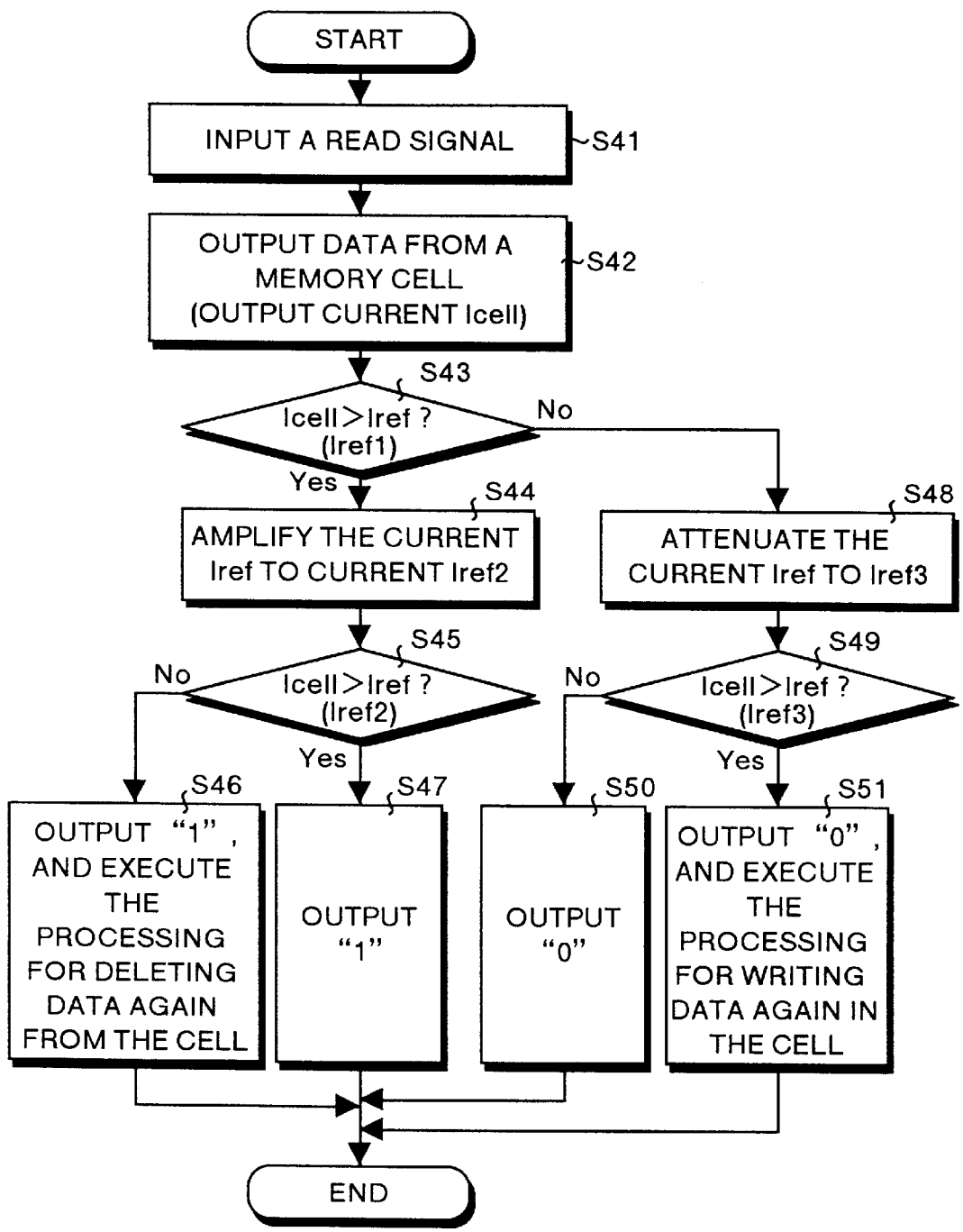
FIG. 7 is a flow chart showing a process of prevention of illegal transformation of data in the third embodiment.

A process of prevention of illegal transformation of data in the third embodiment of the present invention is explained below with reference to the flow chart shown in FIG. 7. As shown in FIG. 7, when the control circuit 5 receives a read signal through the I/O buffer terminal 6, the control circuit 5 sends the read signal to the reading/writing/deletion circuit 4 to make it execute the process of reading a data from the memory cell array 1 (step S41). With this operation, a current Icell is output from a target memory cell of the memory cell array 1 (step S42).

The amplification/attenuation circuit 8 under the control of the control circuit 5 outputs the reference current Iref1 as it is to the sense amplifier SA. The current Icell and the reference current Iref1 output from the amplification/attenuation circuit 8 are input into the sense amplifier SA. The amplifier SA compares the two currents and inputs a result of comparison into the control circuit 5. The control circuit 5 determines based on the result of comparison by the sense amplifier SA whether the current Icell is greater than the reference current Iref1 or not (step S43).

When it is determined that the current Icell is greater than the reference current Iref1 (step S43, YES), the control circuit 5 make the amplification/attenuation circuit 8 amplify the reference current Iref1 so that the reference current Iref2 is output (step S44). The control circuit 5 then determines whether the current Icell is greater than the reference current Iref2 or not (step S45). When it is determined that the current Icell is greater than the reference current Iref2 (step S45, YES), the control circuit 5 outputs information "1" as the information regarding the target memory cell (step S47) and the process is terminated.

When it is determined that the current Icell is not greater than the reference current Iref2 (step S45, NO), the control circuit 5 outputs information "1" as the information regarding the target memory cell and the process of deletion of data from the target memory cell is executed once more (step S46). The process is then terminated. The process of deletion of data is executed once more in order to insure the output of the information "1".

When it is determined that the current Icell is not greater than the reference current Iref1 (step S43, NO), the control circuit 5 makes the amplification/attenuation circuit 8 attenuate the reference current Iref1 so that the reference current Iref3 is output (step S48). The control circuit 5 then determines whether the current Icell is greater than the reference current Iref3 or not (step S49). When it is determined that the current Icell is not greater than the reference current Iref3 (step S49, NO), the control circuit 5 outputs information "0" as the information regarding the target memory cell (step S50) and the process is terminated.

When it is determined that the current Icell is greater than the reference current Iref 3 (step S49, YES), the control circuit 5 outputs information "0" as the information regarding the target memory cell and the process of writing data in the target memory cell is executed once more (step S51). The process is then terminated. The process of writing data is executed once more in order to insure output of the information "0".

The processing for writing or deleting data once more in the steps S46 and S51 are executed each time in the description above, but the configuration is allowable in which an address of a memory cell requiring the processing for writing or deleting data again and information indicating the necessity of "deleting again" or "writing again" or the like are stored, and the processing for deleting data again or for writing data again" is executed based on the stored data and information to each memory cell when there is no access to the memory cell array 1. By executing the processing for deleting data again or for writing data again as described above, it is possible to efficiently execute the processing for deleting data again or for writing data again. Further, access to the memory cell array 1 is not hindered, so that the high speed processing for reading out data can be insured.

In the third embodiment described above, it is explained that the amplification/attenuation circuit 8 amplifies or attenuates the reference current Iref1, but the configuration is not limited to the one described above. The amplification/attenuation circuit 8 may amplify or attenuate other reference current having. For instance, the amplification/attenuation circuit 8 may attenuate the reference current Iref2 so as to output the reference currents Iref1 or Iref3.

According to the third embodiment described above, the current Icell output from a memory cell is monitored when data is read out, and further whether charge gain or charge loss has occurred or not is determined based on the reference currents Iref2 and Iref3, and the processing for deleting data again from the memory cell or for writing data again in the memory cell is executed based on the result of determination. One reference current Iref1 is amplified or attenuated by the amplification/attenuation circuit 8, and one of the amplified or attenuated reference currents Iref1 to Iref3 is output to one sense amplifier SA. Thus, it is possible to preserve a storage state in a memory cell at high reliability with easy configuration, and also to prevent illegal transformation of data. Further, whether the current Icell is greater than the reference current Iref2 or Iref3 or not is determined based on a result of comparison between the current Iref1 and current Iref 2, so that the efficient processing for determination can be executed.

A fourth embodiment of the present invention is described below. In the third embodiment described above, the reference current Iref1 output from one reference current cell 3a is amplified or attenuated to generate the reference current Iref2 or Iref3, and the generated reference current is output to the sense amplifier SA and is compared with the current Icell. In this fourth embodiment, however, the reference current Iref1 output from the reference current cell 3a is output as it is to the sense amplifier SA. Even with this configuration, the same result of comparison can be obtained as that in a case where the reference currents Iref2 and Iref3 are relatively compared by amplifying or attenuating a value of the current Icell outputted from a memory cell.

Figure 8:
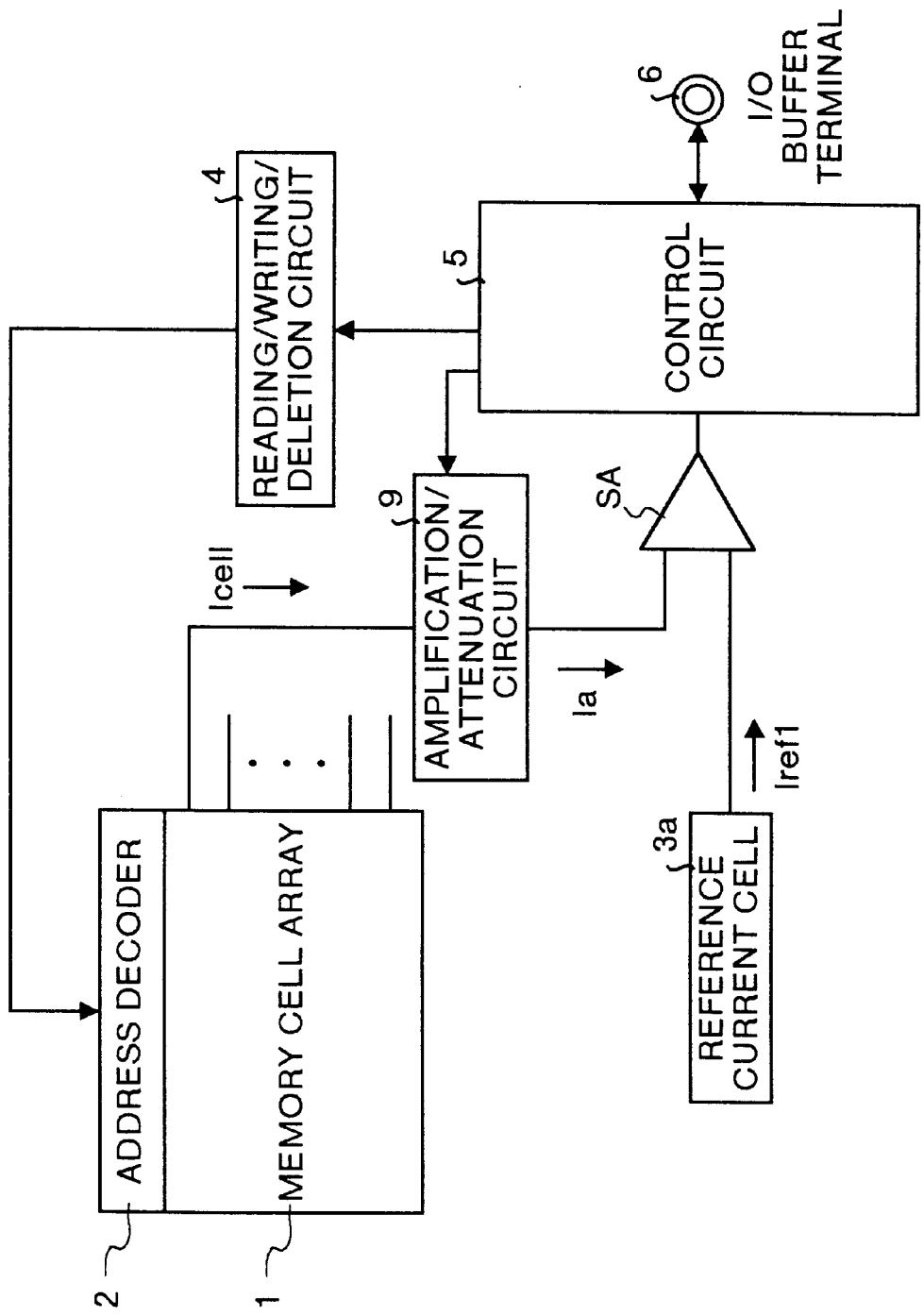
FIG. 8 shows a configuration of a circuit that prevents illegal transformation of data in a non-volatile memory according to a fourth embodiment of the present invention.

FIG. 8 shows a configuration of the circuit that prevents illegal transformation of data in a non-volatile memory according to the fourth embodiment of the present invention. In the circuit shown in FIG. 8, an amplification/attenuation circuit 9 which amplifies or attenuates the current Icell output from a memory cell is newly provided. The sense amplifier SA compares a current Ia output from this amplification/attenuation circuit 9 with the reference current Iref1 output from the reference current cell 3a. The remaining configuration is the same as that of the third embodiment, and the same reference numerals are assigned to the corresponding components.

The sense amplifier SA compares the current Ia output from the amplification/attenuation circuit 9 with the reference current Iref1, and inputs the result of comparison into the control circuit 5. The current Ia is any of the currents Icell, Icell2 and Icell3. The current Icell2 is obtained by the attenuation of the current Icell in such a manner that the same relation as that between the reference current Iref2 and current Icell is preserved even when compared to the current Iref1 as a reference. Further, the current Icell3 is obtained by the amplification of the current Icell in such a manner that the same relation as that between the reference current Iref3 and reference current Icell is preserved even when compared to the current Iref1 as a reference. In other words, the relation between each of the currents Icell, Icell2 and Icell3 is basically the same as that between the current Icell and each of the reference currents Iref1, Iref2 and Iref3 in the third embodiment.

The control circuit 5 determines whether the information regarding the target memory cell is "1" or "0" based on the result of comparison between the reference current Iref1 and current Ia. The control circuit 5 makes the amplification/attenuation circuit 9 attenuate the current Icell so that the current Icell2 is output, or makes the amplification/attenuation circuit 9 amplify the current Icell so that the current Icell3 is output. Further, the control circuit 5 executes the processing for deleting data from or writing data once more in the memory cell based on the result of comparison after the setting above. Further, the control circuit 5 executes the initial setting to respond to the necessity of reading data from other memory cell so that an output from the amplification/attenuation circuit 9 will be the current Icell.

Figure 9:
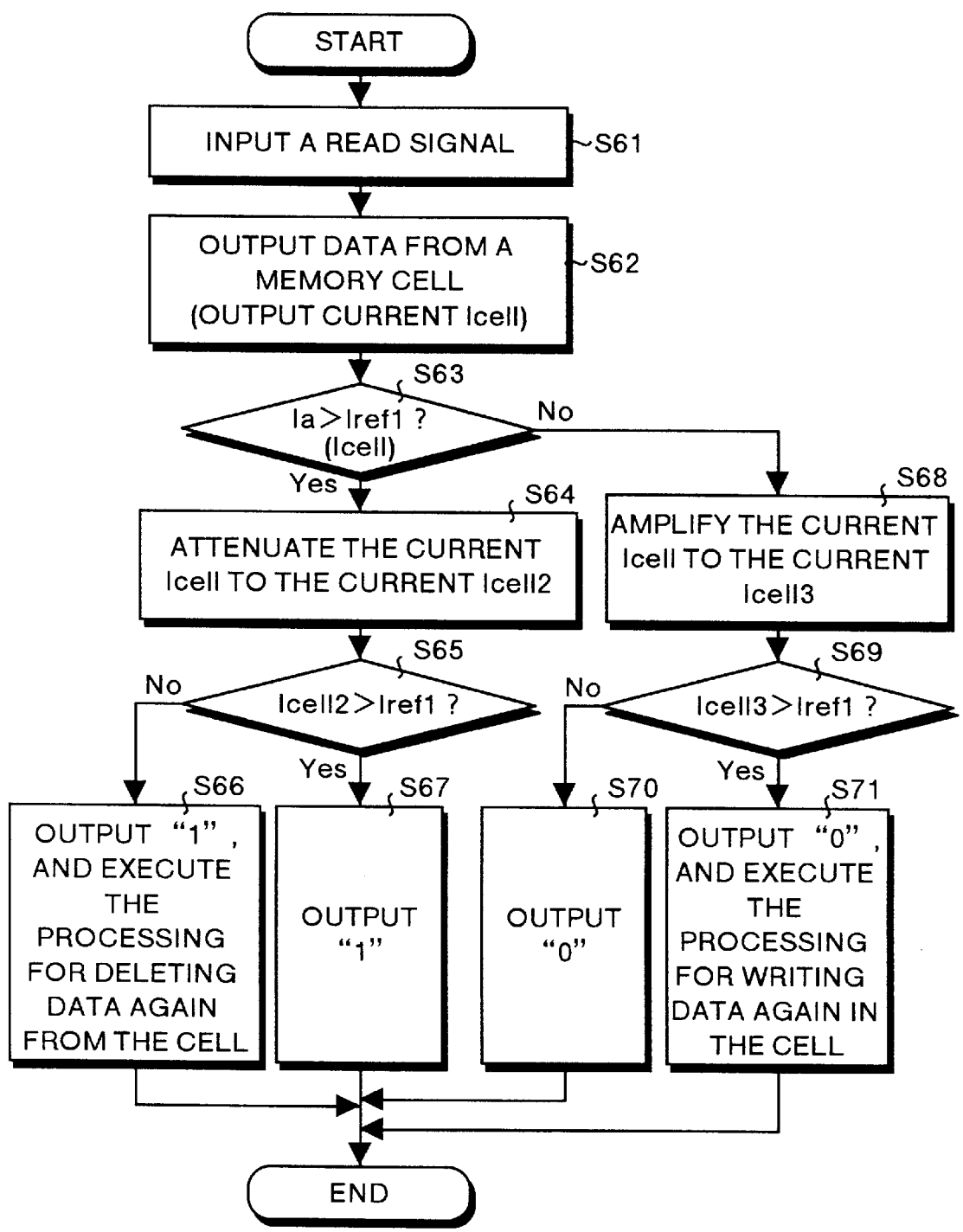
FIG. 9 is a flow chart showing a process of prevention of illegal transformation of data in the fourth embodiment.

A process of prevention of illegal transformation of data in the fourth embodiment of the present invention is explained below with reference to the flow chart shown in FIG. 9. As shown in FIG. 9, when the control circuit 5 receives a read signal through the I/O buffer terminal 6, the control circuit 5 sends the read signal to the reading/writing/deletion circuit 4 to make it execute the process of reading a data from the memory cell array 1 (step S61). With this operation, a current Icell is output from a target memory cell of the memory cell array 1 (step S62).

The amplification/attenuation circuit 9 is initially set under controls by the control circuit 5 so that the current Icell is output as it is to the sense amplifier SA. The current Icell output from the amplification/attenuation circuit 9 and the reference current Iref1 output from the reference current cell 3a are input into the sense amplifier SA. The sense amplifier SA compares the two currents and inputs a result of comparison into the control circuit 5. The control circuit 5 determines based on the result of comparison by the sense amplifier SA whether the current Icell is greater than the reference current Iref1 or not.

When it is determined that the current Icell is greater than the reference current Iref1 (step S63, YES), the control circuit 5 makes the amplification/attenuation circuit 9 attenuate the current Icell so that the current Icell2 is output (step S64). When obtaining the current Icell2 by attenuating the current Icell, the amount of attenuation is the same as that when Iref1 is obtained by attenuating the current Iref2. The control circuit 5 then determines whether the current Icell2 is greater than the reference current Iref1 or not (step S65). When it is determined that the current Icell2 is greater than the reference current Iref1 (step S65, YES), the control circuit 5 outputs information "1" as the information regarding the target memory cell (step S67) and the process is terminated.

When it is determined that the current Icell2 is not greater than the reference current Iref1 (step S65, NO), the control circuit 5 outputs information "1" as the information regarding the target memory cell and the process of deletion of data from the target memory cell is executed once more (step S66). The process is then terminated. The process of deletion of data is executed once more in order to insure the output of the information "1".

When it is determined that the current Icell is not greater than the reference current Iref1 (step S63, NO), the control circuit 5 makes the amplification/attenuation circuit 9 amplify the current Icell so that the current Icell3 is output (step S68). When obtaining the current Icell3 by amplifying the current Icell, the amount of amplification is the same as that when Iref1 is obtained by amplifying the current Iref3. The control circuit 5 then determines whether the current Icell3 is greater than the reference current Iref1 or not (step S69). When it is determined that the current Icell3 is not greater than the reference current Iref1 (step S69, NO), the control circuit 5 outputs information "0" as the information regarding the target memory cell (step S70) and the process is terminated.

When it is determined that the current Icell is greater than the reference current Iref1 (step S69, YES), the control circuit 5 outputs information "0" as the information regarding the target memory cell and the process of writing data in the target memory cell is executed once more (step S71). The process is then terminated. The process of writing data is executed once more in order to insure output of the information "0".

The processing for writing or deleting data once more in the steps S66 and S71 are executed each time in the description above, but the configuration is allowable in which an address of a memory cell requiring the processing for writing or deleting data again and information indicating the necessity of "deleting again" or "writing again" or the like are stored, and the processing for deleting data again or for writing data again" is executed based on the stored data and information to each memory cell when there is no access to the memory cell array 1. By executing the processing for deleting data again or for writing data again as described above, it is possible to efficiently execute the processing for deleting data again or for writing data again. Further, access to the memory cell array 1 is not hindered, so that the high speed processing for reading out data can be insured.

According to the fourth embodiment described above, the current Icell outputted from a memory cell when data is read out is monitored, and further whether charge gain or charge loss has occurred or not is determined based on a value obtained by amplifying or attenuating the current value Icell from the memory cell, and the processing for deleting data again from the memory cell or for writing data again in the memory cell is executed based on the result of determination. Thus, it is possible to preserve a storage state in a memory cell at high reliability with a simple configuration. Further, comparison between the reference current Iref1 and the current Icell2 or Icell3 based on the result of comparison between the reference current Iref1 and current Icell, so that the processing for determination can efficiently be executed.

A fifth embodiment of the present invention is described below. In the first to fourth embodiments, when the processing for reading data from a memory cell is executed, if prespecified conditions are satisfied, the processing for writing data or for deleting data is executed once more. In the fifth embodiment, however, the processing for reading data from an arbitrary memory cell is forcefully executed in response to a test mode signal, and when this processing for reading out data is executed, the processing for writing data in or deleting data once more from the memory cell is executed.

Figure 10:
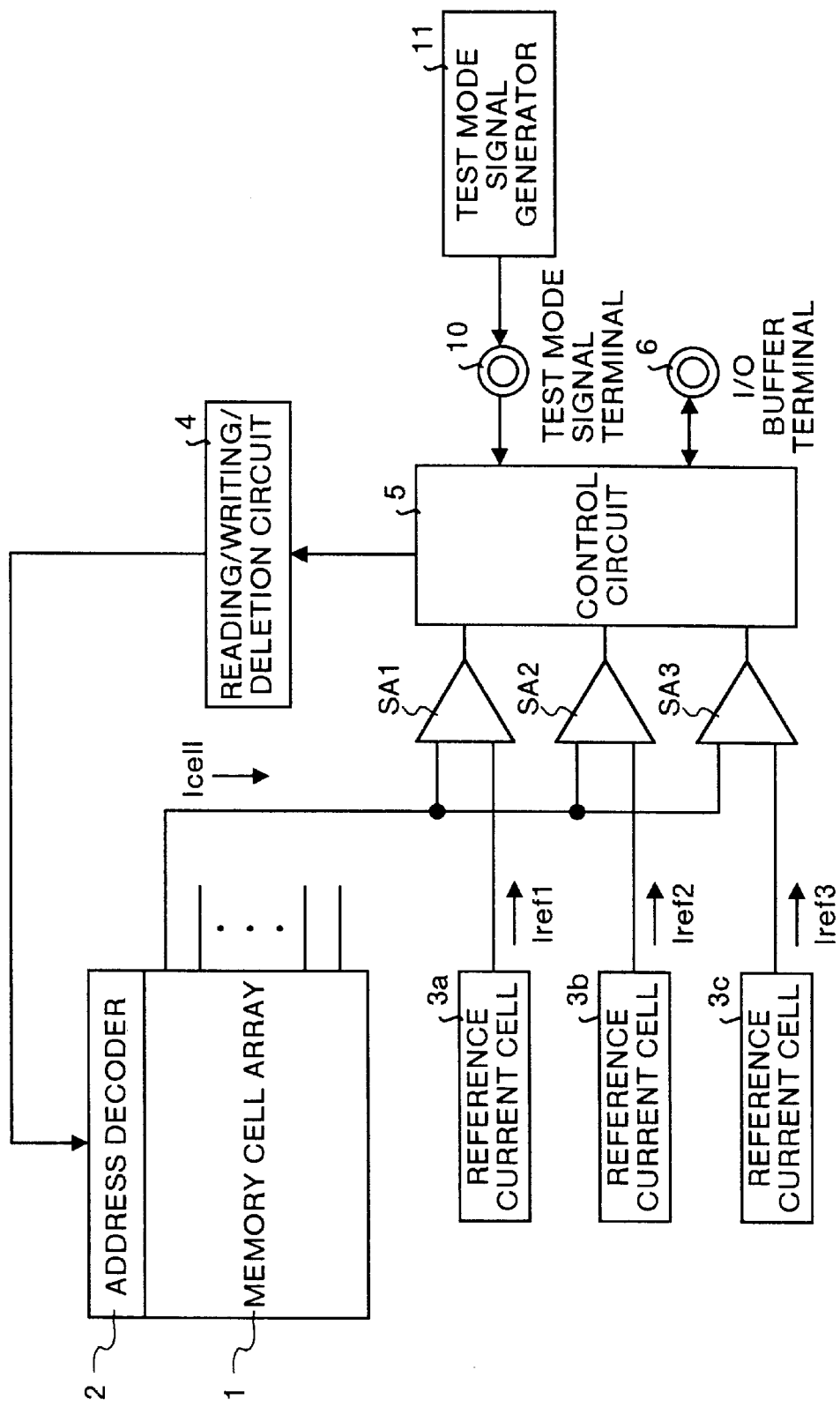
FIG. 10 shows a configuration of a circuit that prevents illegal transformation of data in a non-volatile memory according to a fifth embodiment of the present invention.

FIG. 10 shows a configuration of the circuit that prevents illegal transformation of data in a non-volatile memory according to the fifth embodiment. In the circuit shown in FIG. 10, the control circuit 5 reads out data from a memory cell based on data for a test mode signal input from a test mode signal terminal 10, and when prespecified conditions are satisfied, the control circuit 5 executes the processing for writing data in or deleting data again from the memory cell like that in the first embodiment. Remaining configuration is the same as those in the first embodiment, and the same reference numerals are assigned to corresponding components.

When a test mode signal is input, the processing for reading out data is executed to all the memory cells. Such a processing is executed because there may be a case in which data from some of memory cells in the memory cell array 1 never read out and the state continues for a long time.

Figure 11:
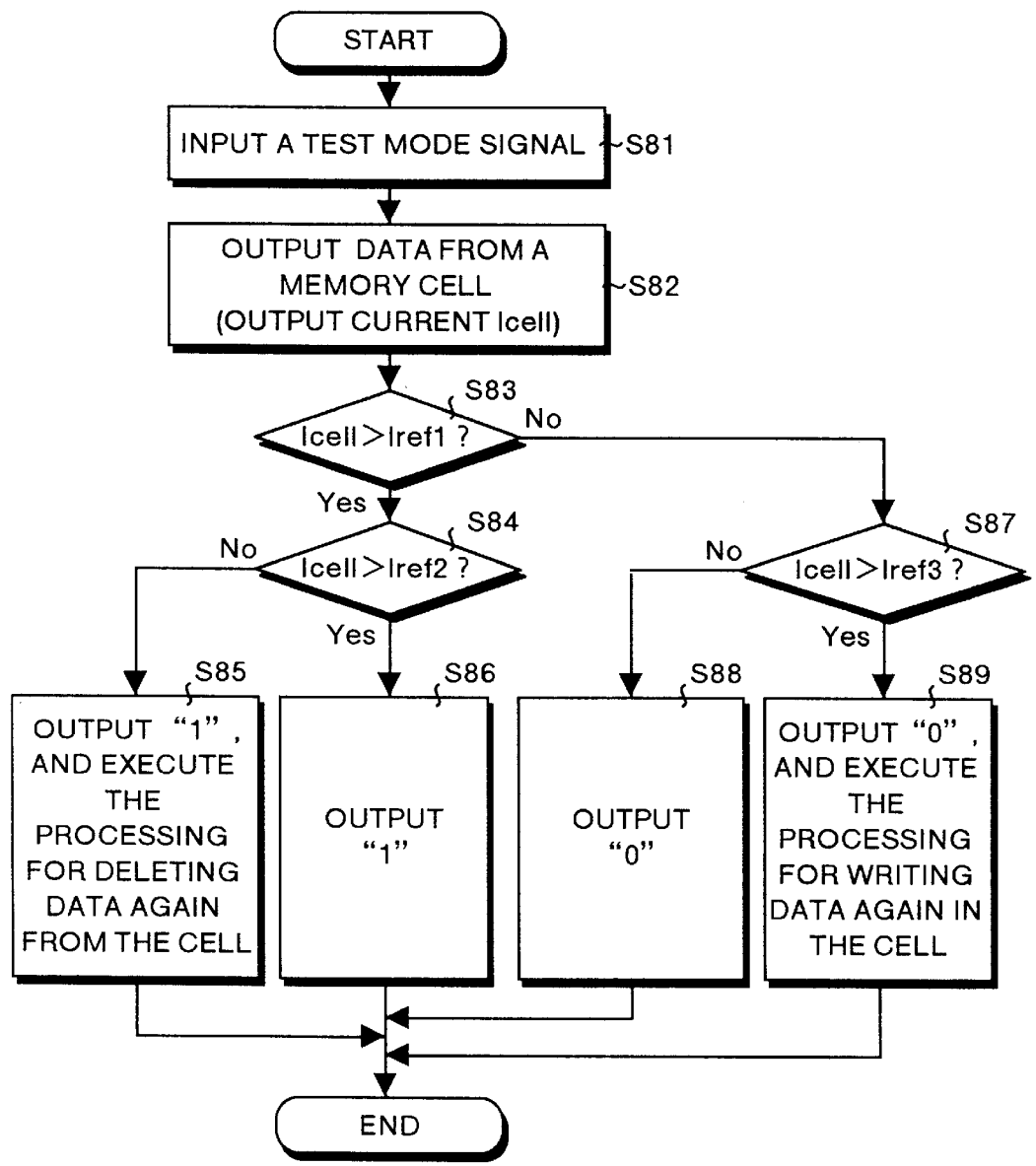
FIG. 11 is a flow chart showing a process of prevention of illegal transformation of data in the fifth embodiment.

A process of prevention of illegal transformation of data in the fifth embodiment of the present invention is explained below with reference to the flow chart shown in FIG. 11. The process in the fifth embodiment is the same as that in the first embodiment excluding the point that, the test mode signal is input in place of inputting a read signal (step S61) as in the first embodiment. Precisely, as shown in FIG. 11, when the control circuit 5 receives an external test mode signal through the I/O buffer terminal 6, the control circuit 5 sends the read signal to the reading/writing/deletion circuit 4 to make it execute the process of reading a data from the memory cell array 1 (step S81). With this operation, the current Icell is output from a target memory cell of the memory cell array 1 (step S82).

The current Icell is input into the sense amplifiers SA1, SA2 and SA3, and is compared with the respective reference current Iref1, Iref2 and Iref3. The control circuit 5 executes the following processing based on the result of comparison by the sense amplifiers SA1, SA2 and SA3. At first the control circuit 5 determines whether the current Icell is greater than the reference current Iref1 or not (step S83). When it is determined that the current Icell is greater than the reference current Iref1 (step S83, YES), the control circuit 5 further determines whether the current Icell is greater than the reference current Iref2 or not (step S84). When it is determined that the current Icell is greater than the reference current Iref2 (step S84, YES), the control circuit 5 outputs information "1" as the information regarding the target memory cell (step S86) and the process is terminated.

When it is determined that the current Icell is not greater than the reference current Iref2 (step S84, NO), the control circuit 5 outputs information "1" as the information regarding the target memory cell and the process of deletion of data from the target memory cell is executed once more (step S85). The process is then terminated. The process of deletion of data is executed once more in order to insure the output of the information "1".

When it is determined that the current Icell is not greater than the reference current Iref1 (step S83, NO), the control circuit 5 further determines whether the current Icell is greater than the reference current Iref3 or not (step S87). When it is determined that the current Icell is not greater than the reference current Iref3 (step S87, NO), the control circuit 5 outputs information "0" as the information regarding the target memory cell (step S88) and the process is terminated.

When it is determined that the current Icell is greater than the reference current Iref3 (step S87, YES), the control circuit 5 outputs information "0" as the information regarding the target memory cell and the process of writing data in the target memory cell is executed once more (step S89). The process is then terminated. The process of writing data is executed once more in order to insure output of the information "0".

The processing for writing or deleting data once more in the steps S85 and S89 are executed each time in the description above, but the configuration is allowable in which an address of a memory cell requiring the processing for writing or deleting data again and information indicating the necessity of "deleting again" or "writing again" or the like are stored, and the processing for deleting data again or for writing data again" is executed based on the stored data and information to each memory cell when there is no access to the memory cell array 1. By executing the processing for deleting data again or for writing data again as described above, it is possible to efficiently execute the processing for deleting data again or for writing data again. Further, access to the memory cell array 1 is not hindered, so that the high speed processing for reading out data can be insured.

Description of the fifth embodiment above assumes that the configuration is applied to the first embodiment, but the configuration can similarly be applied to second to fourth embodiments. In this case, as described above, the difference is only that a test mode signal is used in place of a read signal. The processing for reading data from a memory cell may be executed periodically without using an external test mode signal.

According to the fifth embodiment described above, when a test mode signal is input and if prespecified conditions are satisfied, the processing for writing data in or for deleting data again from the memory cell is executed, so that a storage state in a memory cell can be preserved with high reliability for a longer time and illegal transformation of data can be prevented.

A sixth embodiment of the present invention is described below. In the fifth embodiment described above, the processing for reading out data from a memory cell is forcefully executed in response to a test mode signal, and when prespecified conditions are satisfied, the processing for writing data in or deleting data from the memory cell is executed. In the sixth embodiment, however, the processing for reading out data is executed as the initial processing to all memory cells when power is turned ON, and when prespecified conditions are satisfied, the processing for writing data or deleting data again is executed.

Figure 12:
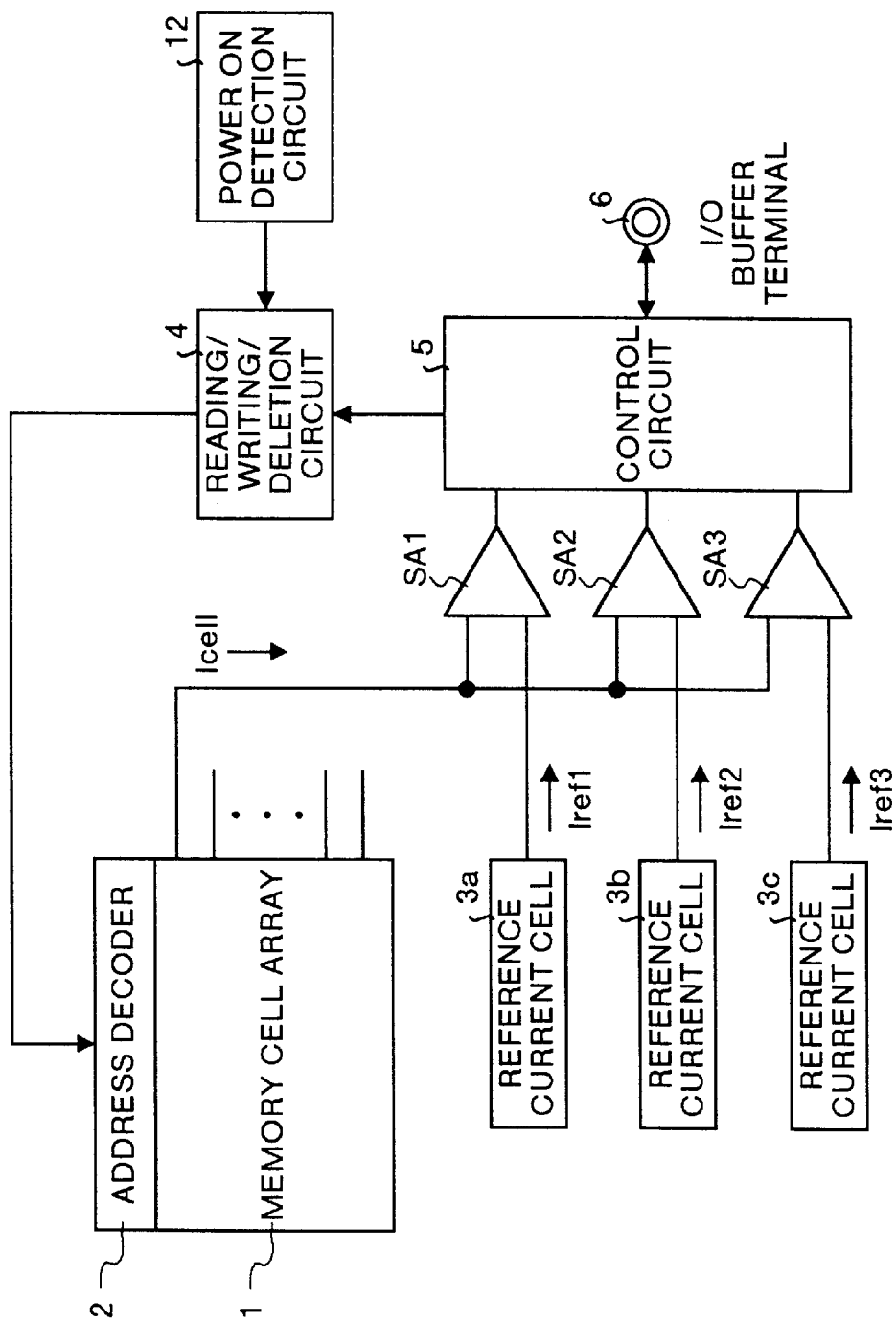
FIG. 12 shows a configuration of a circuit that prevents illegal transformation of data in a non-volatile memory according to a sixth embodiment of the present invention.

FIG. 12 shows a configuration of the circuit that prevents illegal transformation of data in a non-volatile memory according to the sixth embodiment of the present invention. In the circuit shown in FIG. 12, a power ON detection circuit 12 is additionally provided. When the power ON detection circuit 12 detects that the power is ON, the reading/writing/deletion circuit 4 executes the processing for reading out data from all of the memory cells. Remaining configuration is the same as those in the first embodiment, and the same reference numerals are assigned to the corresponding components. It has been shown in FIG. 12 that the result of detection of ON of the power is directly input from the power ON detection circuit 12 into the reading/writing/deletion circuit 4, and the reading/writing/deletion circuit 4 directly accesses all of memory cells for reading data therefrom, however the configuration of the present invention is not limited to this. A configuration is allowable in which the result of detection of ON of the power is input from the power ON detection circuit 12 into the control circuit 5, and the control circuit 5 makes the reading/writing/deletion circuit 4 execute the processing for reading out data.

Figure 13:
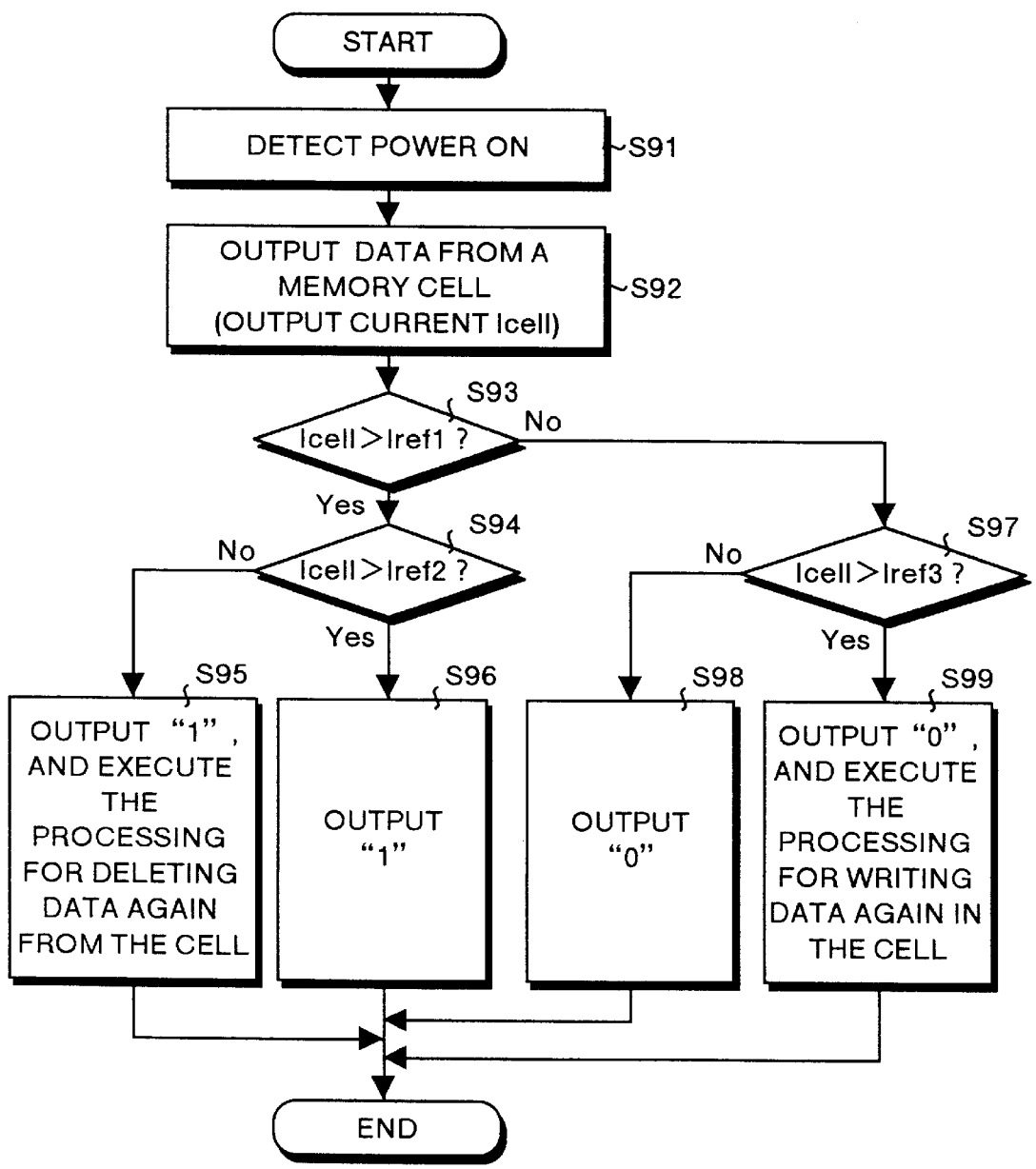
FIG. 13 is a flow chart showing a process of prevention of illegal transformation of data in the sixth embodiment.

A process of prevention of illegal transformation of data in the sixth embodiment of the present invention is explained below with reference to the flow chart shown in FIG. 13. As shown in FIG. 13, when the reading/writing/deletion circuit 4 receives a result of detection that indicates that the power is turned ON from the power ON detection circuit 12 (step S91), the reading/writing/detection circuit 4 accesses all the memory cells successively for reading out data therefrom, and the current Icell is output from a target memory cell of the memory cell array 1 (step S92).

This current Icell is input into the sense amplifiers SA1, SA2 and SA3, and is compared with the respective reference currents Iref1, Iref2 and Iref3. The control circuit 5 executes the following processing based on a result of comparison by the sense amplifiers SA1, SA2 and SA3. At first, the control circuit 5 determines whether the current Icell is greater than the reference current Iref1 or not (step S93). When it is determined that the current Icell is greater than the reference current Iref1 (step S93, YES), the control circuit 5 further determines whether the current Icell is greater than the reference current Iref2 or not (step S94). When it is determined that the current Icell is greater than the reference current Iref2 (step S94, YES), the control circuit 5 outputs information "1" as the information regarding the target memory cell (step S96) and the process is terminated.

When it is determined that the current Icell is not greater than the reference current Iref2 (step S94, NO), the control circuit 5 outputs information "1" as the information regarding the target memory cell and the process of deletion of data from the target memory cell is executed once more (step S95). The process is then terminated. The process of deletion of data is executed once more in order to insure the output of the information "1".

When it is determined that the current Icell is not greater than the reference current Iref1 (step S93, NO), the control circuit 5 further determines whether the current Icell is greater than the reference current Iref3 or not (step S97). When it is determined that the current Icell is not greater than the reference current Iref3 (step S97, NO), the control circuit 5 outputs information "0" as the information regarding the target memory cell (step S98) and the process is terminated.

When it is determined that the current Icell is greater than the reference current Iref3 (step S97, YES), the control circuit 5 outputs information "0" as the information regarding the target memory cell and the process of writing data in the target memory cell is executed once more (step S99). The process is then terminated. The process of writing data is executed once more in order to insure output of the information "0".

The processing for writing or deleting data once more in the steps S95 and S99 are executed each time in the description above, but the configuration is allowable in which an address of a memory cell requiring the processing for writing or deleting data again and information indicating the necessity of "deleting again" or "writing again" or the like are stored, and the processing for deleting data again or for writing data again" is executed based on the stored data and information to each memory cell when there is no access to the memory cell array 1. By executing the processing for deleting data again or for writing data again as described above, it is possible to efficiently execute the processing for deleting data again or for writing data again. Further, access to the memory cell array 1 is not hindered, so that the high speed processing for reading out data can be insured.

Description of the sixth embodiment above assumes that the configuration is applied to the first embodiment, but the configuration can similarly be applied to the second to fourth embodiments. In this case, as described above, the difference is only that a read signal is used to indicate detection of power ON.

According to the sixth embodiment described above, each time power is turned ON, the processing for reading out data from all of memory cells is forcefully executed, and when prespecified conditions are satisfied, the processing for writing data in or deleting data again from a memory cell is executed. Thus, a data storage state of the memory cell can be preserved with high reliability, illegal transformation of data can be prevented before its occurrence.

According to one aspect of the present invention, when data is read out from a cell, the control circuit determines based on a result of comparison by the comparison circuit whether a cell current is greater than a first reference current. The control circuit outputs information "1" or "0" corresponding to a respective case based on the result of determination, recognizes, when a cell current is not greater than second reference current or greater than a third reference current, that charge gain or charge loss has occurred in a cell corresponding to the cell current, and makes the writing/deletion circuit execute the processing for writing data in or deleting data again from the cell. Therefore, there is provided the advantage that preservation of a written or deleted state of each cell in a non-volatile memory is insured, and illegal transformation of data can be prevented.

According to another aspect of the present invention, when data is read from a cell, the control circuit makes the selection circuit select a first generation circuit as the initial state and determines based on a result of comparison by the comparison circuit whether a cell current is greater than a first reference current or not. The control circuit then outputs information "1" or "0" corresponding to a respective case based on the result of determination. Further, the control circuit connects the select circuit to the second generation circuit or the third generation circuit based on the result of determination. When it is determined based on a result of comparison by the comparison circuit that the cell current is not greater than the second reference current or greater than the third reference current, the control circuit recognizes that charge gain or charge loss has occurred in a cell corresponding to the cell current, and makes the writing/deletion circuit execute the processing for writing data in or deleting data again from the cell. Therefore, there is provided the advantage that preservation of a written or deleted state of each cell in a non-volatile memory is insured with simple configuration, and illegal transformation of data can be prevented.

According to still another aspect of the present invention, when data is read out from a cell, the control circuit previously sets an amplification factor or an attenuation factor in the amplification/attenuation circuit to zero as the initial value, and determines based on a result of comparison by the comparison circuit whether a cell current is greater than a first reference current or not. The control circuit then outputs information "1" or "0" corresponding to a respective case based on the result of determination. The control circuit then changes the amplification factor or the attenuation factor in the amplification/attenuation circuit based on the result of determination, and generates a second or third reference current. When it is determined based on a result of comparison by the comparison circuit that the cell current is not greater than the second reference current or greater than the third reference current, the control circuit recognizes that charge gain or charge loss has occurred in a cell corresponding to the cell current, and makes the writing/deletion circuit execute the processing for writing data in or deleting data from the cell. Therefore, there is provided the advantage that preservation of a written or deleted state of each cell in a non-volatile memory is insured with simple configuration, and illegal transformation of data can be prevented.

According to still another aspect of the present invention, when data is read out from a cell, the control circuit previously sets an amplification factor or an attenuation factor in the amplification/attenuation circuit to zero as the initial value. The control circuit then determines based on a result of comparison by the comparison circuit whether a cell current is greater than a first reference current or not and outputs information "1" or "0" corresponding to a respective case based on the result of determination. The control circuit then changes the amplification factor or the attenuation factor in the amplification/attenuation circuit based on the result of determination and generates a second or third cell current. When it is determined based on the result of comparison that the second cell current is not greater than the first reference current or the third cell current is greater than the first reference current, the control circuit recognizes that charge gain or charge loss has occurred in a cell corresponding to the cell current, and makes the writing/deletion circuit execute the processing for writing data in or deleting data again from the cell. Thus, there is provided the advantage that preservation of a written or deleted state of each cell in a non-volatile memory is insured with simple configuration, and illegal transformation of data can be prevented.

Further, a test mode signal which is an external signal is input into a control circuit, and the control circuit has the processing for reading out data forcefully executed like in the ordinary processing for reading out data. When it is determined that charge gain or charge loss has occurred in the cell from which data is read out, the control circuit makes the writing/deletion circuit execute the processing for writing data in or deleting data again from the cell. Therefore, there is provided the advantage that preservation of a written or deleted state of each cell in a non-volatile memory is insured and illegal transformation of data can be prevented.

Further, the detection circuit detects whether the power is turned ON. When the power is turned ON, the processing for reading data from each cell is executed. When it is determined that charge gain or charge loss has occurred in a cell from which data is readout, the control circuit makes the writing/deletion circuit execute the processing for writing data in or deleting data again from the cell. Therefore, there is provided the advantage that preservation of a written or deleted state of each cell in a non-volatile memory is insured and illegal transformation of data can be preserved.

Further, when conditions for occurrence of charge gain or charge loss are satisfied, the control circuit stores an address of a cell corresponding to the cell current. When there is no access to said each cell, the control circuit makes the writing/deletion circuit execute the processing for writing data in or deleting data again from a cell having the address. Therefore, there is provided the advantage that the smooth access processing to a non-volatile memory is not hindered and illegal transformation of data in each cell can be prevented.

According to still another aspect of the present invention, data is read out from each of cells in an electrically-rewritable non-volatile memory in a reading step. Further, in a comparison step, a cell current for data read out in the reading step is compared to each of a first reference current which has a reference current value for determining data based of a current value of the cell current, a second reference current having a larger current value as compared to that of the first reference current, and a third reference current having a smaller current as compared to that of the first reference current. In a rewriting/re-deleting step, whether the cell current is greater than the first reference current or not is determined based on the result of comparison in the comparison step. When it is determined based on the result of determination that the cell current is not greater than the second reference current or greater than the third current, data is deleted from or written again in a cell corresponding to the cell current. Therefore, there is provided the advantage that preservation of a written or deleted cell of each cell in a non-volatile memory is insured and illegal transformation of data can be prevented.

Further, in the rewriting/re-deleting step, when conditions for occurrence of charge gain or charge loss are satisfied, a address of a cell corresponding to the cell current is stored. When a cell is not accessed, data is deleted from or written again in a cell having the address. Therefore, the smooth access processing to a non-volatile memory is not hindered and illegal transformation of data can be prevented efficiently.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A circuit that prevents illegal transformation of data in a non-volatile memory, said circuit comprising:
   a current generation circuit which generates a first, second and third reference current as reference currents for comparison with a cell current which cell current is the current read from a cell of said non-volatile memory, wherein the second reference current is larger in magnitude than the first reference current and the third reference current is smaller in magnitude than the first reference current;
   a comparison circuit which compares the magnitude of the cell current with the magnitude of each of the first to third reference currents;
   a writing/deletion circuit which writes data in or deletes data from the cells of said non-volatile memory; and
   a control circuit which outputs an information regarding presence or absence of charge in a target cell based on the result of comparison by said comparison circuit, and makes said writing/deletion circuit execute writing data in or deletion of data from a target cell of said non-volatile memory once more when the conditions that the cell current is not greater than the second reference current or the cell current is greater than the third reference current are satisfied.

2. The circuit that prevents illegal transformation of data in a non-volatile memory according to claim 1 further having a test state terminal into which is input an external test state signal that controls reading out of data from said cells of said non-volatile memory,
   wherein said control circuit makes said writing/deletion circuit execute writing data in or deletion of data from a target cell of said non-volatile memory, and makes said writing/deletion circuit execute writing data in or deletion of data from a target cell of said non-volatile memory once more when the conditions are satisfied.

3. The circuit that prevents illegal transformation of data in a non-volatile memory according to claim 1 further having a detection circuit which detects whether power is turned ON,
   wherein said control circuit makes said writing/deletion circuit execute writing data in or deletion of data from a target cell of said non-volatile memory when said detection circuit detects that the power is turned ON, and makes said writing/deletion circuit execute writing data in or deletion of data from a target cell of said non-volatile memory once more when the conditions are satisfied.

4. The circuit that prevents illegal transformation of data in a non-volatile memory according to claim 1, wherein said control circuit maintains an address of a cell whose cell current satisfies the conditions, and makes said writing/deletion circuit execute writing data in or deletion of data from said cell once more when said cell is not accessed.

5. A circuit that prevents illegal transformation of data in a non-volatile memory, said circuit comprising:
   a first current generation circuit which generates a first reference current as a reference current for comparison with a cell current which cell current is the current read from a cell of said non-volatile memory;
   a second current generation circuit which generates a second reference current as a reference current for comparison with the cell current which second current is greater in magnitude than the magnitude of the first reference current;
   a third current generation circuit which generates a third reference current as a reference current for comparison with the cell current which third current is smaller in magnitude than the magnitude of the first reference current;

a selection circuit which selects and outputs any of the first to third reference currents;

a comparison circuit which compares the magnitude of the cell current with the magnitude of the reference current output from said selection circuit;

a writing/deletion circuit which writes data in or deletes data from the cells of said non-volatile memory; and a control circuit which controls said selection circuit so as output the first reference current, outputs an information regarding presence or absence of charge in a target cell based on the result of comparison by said comparison circuit, then controls said selection circuit so as to output the second or the third reference current, and makes said writing/deletion circuit execute writing data in or deletion of data from a target cell of said non-volatile memory once more when the conditions that the cell current is not greater than the second reference current or the cell current is greater than the third reference current are satisfied.

6. The circuit that prevents illegal transformation of data in a non-volatile memory according to claim 5 further having a test state terminal into which is input an external test state signal that controls reading out of data from said cells of said non-volatile memory, wherein said control circuit makes said writing/deletion circuit execute writing data in or deletion of data from a target cell of said non-volatile memory, and makes said writing/deletion circuit execute writing data in or deletion of data from a target cell of said non-volatile memory once more when the conditions are satisfied.

7. The circuit that prevents illegal transformation of data in a non-volatile memory according to claim 5 further having a detection circuit which detects whether power is turned ON, wherein said control circuit makes said writing/deletion circuit execute writing data in or deletion of data from a target cell of said non-volatile memory when said detection circuit detects that the power is turned ON, and makes said writing/deletion circuit execute writing data in or deletion of data from a target cell of said non-volatile memory once more when the conditions are satisfied.

8. The circuit that prevents illegal transformation of data in a non-volatile memory according to claim 5, wherein said control circuit maintains an address of a cell whose cell current satisfies the conditions, and makes said writing/ deletion circuit execute writing data in or deletion of data from said cell once more when said cell is not accessed.

9. A circuit that prevents illegal transformation of data in a non-volatile memory, said circuit comprising:

a current generation circuit which generates a first reference current as a reference current for comparison with a cell current which cell current is the current read from a cell of said non-volatile memory;

an amplification/attenuation circuit which outputs the first reference current as it is, or outputs a second reference current obtained by amplification of the first reference current, or outputs a third reference current obtained by attenuation of the first reference current;

a comparison circuit which compares the magnitude of the cell current with the magnitude of the reference current output from said amplification/attenuation circuit;

a writing/deletion circuit which writes data in or deletes data from the cells of said non-volatile memory; and a control circuit which controls said amplification/ attenuation circuit so as to output the first reference current, outputs an information regarding presence or absence of charge in a target cell based on the result of comparison by said comparison circuit, then controls said amplification/attenuation circuit so as to output the second or the third reference current, and makes said writing/deletion circuit execute writing data in or deletion of data from a target cell of said non-volatile memory once more when the conditions that the cell current is not greater than the second reference current or the cell current is greater than the third reference current are satisfied.

10. The circuit that prevents illegal transformation of data in a non-volatile memory according to claim 9 further having a test state terminal into which is input an external test state signal that controls reading out of data from said cells of said non-volatile memory, wherein said control circuit makes said writing/deletion circuit execute writing data in or deletion of data from a target cell of said non-volatile memory, and makes said writing/deletion circuit execute writing data in or deletion of data from a target cell of said non-volatile memory once more when the conditions are satisfied.

11. The circuit that prevents illegal transformation of data in a non-volatile memory according to claim 9 further having a detection circuit which detects whether power is turned ON, wherein said control circuit makes said writing/deletion circuit execute writing data in or deletion of data from a target cell of said non-volatile memory when said detection circuit detects that the power is turned ON, and makes said writing/deletion circuit execute writing data in or deletion of data from a target cell of said non-volatile memory once more when the conditions are satisfied.

12. The circuit that prevents illegal transformation of data in a non-volatile memory according to claim 9, wherein said control circuit maintains an address of a cell whose cell current satisfies the conditions, and makes said writing/ deletion circuit execute writing data in or deletion of data from said cell once more when said cell is not accessed.

13. A circuit that prevents illegal transformation of data in a non-volatile memory, said circuit comprising:

a current generation circuit which generates a reference current as a reference current for comparison with a cell current which cell current is the current read from a cell of said non-volatile memory;

an amplification/attenuation circuit which outputs the cell current as it is, or outputs a second cell current obtained by attenuation of the first cell current, or outputs a third cell current obtained by amplification of the cell reference current;

a comparison circuit which compares the magnitude of the reference current with the magnitude of the cell current output from said amplification/attenuation circuit;

a writing/deletion circuit which writes data in or deletes data from the cells of said non-volatile memory; and a control circuit which controls said amplification/ attenuation circuit so as to output the first cell current, outputs an information regarding presence or absence of charge in a target cell based on the result of comparison by said comparison circuit, then controls said amplification/attenuation circuit so as to output the second or the third cell current, and makes said writing/deletion circuit execute writing data in or deletion of data from a target cell of said non-volatile memory once more when the conditions that the second cell current is not greater than the reference current or the third cell current is greater than the reference current are satisfied.

14. The circuit that prevents illegal transformation of data in a non-volatile memory according to claim 13 further having a test state terminal into which is input an external test state signal that controls reading out of data from said cells of said non-volatile memory, wherein said control circuit makes said writing/deletion circuit execute writing data in or deletion of data from a target cell of said non-volatile memory, and makes said writing/deletion circuit execute writing data in or deletion of data from a target cell of said non-volatile memory once more when the conditions are satisfied.

15. The circuit that prevents illegal transformation of data in a non-volatile memory according to claim 13 further having a detection circuit which detects whether power is turned ON, wherein said control circuit makes said writing/deletion circuit execute writing data in or deletion of data from a target cell of said non-volatile memory when said detection circuit detects that the power is turned ON, and makes said writing/deletion circuit execute writing data in or deletion of data from a target cell of said non-volatile memory once more when the conditions are satisfied.

16. The circuit that prevents illegal transformation of data in a non-volatile memory according to claim 13, wherein said control circuit maintains an address of a cell whose cell current satisfies the conditions, and makes said writing/deletion circuit execute writing data in or deletion of data from said cell once more when said cell is not accessed.

17. A method of preventing illegal transformation of data in a non-volatile memory, said method comprising the steps of:

reading out of data from each cell of said non-volatile memory;

generation of a first, second and third reference current as reference currents for comparison with a cell current which cell current is the current read from a cell of said non-volatile memory, wherein the second reference current is larger in magnitude than the first reference current and the third reference current is smaller in magnitude than the first reference current;

comparing the magnitude of the cell current with the magnitude of each of the first to third reference currents;

writing data in or deleting data from the cells of said non-volatile memory; and outputting an information regarding presence or absence of charge in a target cell based on the result of comparison in the comparison step, wherein the step of writing data in or deletion of data from a target cell of said non-volatile memory is executed once more when the conditions that the cell current is not greater than the second reference current or the cell current is greater than the third reference current are satisfied.

18. The method of preventing illegal transformation of data in a non-volatile memory according to claim 17 further having a step of maintaining an address of a cell whose cell current satisfies the conditions, wherein the step of writing data in or deletion of data from said cell of said non-volatile memory is executed once more when said cell is not accessed.

* * * * *